United States Patent
Jayaraman et al.

(10) Patent No.: US 10,747,280 B2
(45) Date of Patent: Aug. 18, 2020

(54) RECONFIGURBLE CPU/GPU INTERCONNECT TO MITIGATE POWER/THERMAL THROTTLING

(71) Applicant: International Business Machines Corporation, Armonk, NY (US)

(72) Inventors: Prasanna Jayaraman, Austin, TX (US); Daniel M. Dreps, Georgetown, TX (US); Erich Jurg Hauptli, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 16/201,511

(22) Filed: Nov. 27, 2018

(65) Prior Publication Data
US 2020/0166977 A1    May 28, 2020

(51) Int. Cl.
*G06F 1/20* (2006.01)
*H05K 7/14* (2006.01)
*H05K 7/20* (2006.01)
*G06F 13/40* (2006.01)

(52) U.S. Cl.
CPC .......... *G06F 1/206* (2013.01); *G06F 13/4027* (2013.01); *H05K 7/1489* (2013.01); *H05K 7/1492* (2013.01); *H05K 7/20736* (2013.01); *H05K 7/20836* (2013.01)

(58) Field of Classification Search
None
See application file for complete search history.

(56) References Cited

U.S. PATENT DOCUMENTS

| 7,210,048 B2 | 4/2007 | Bodas |
| 7,561,163 B1 | 7/2009 | Johnson |
| 8,253,749 B1 | 8/2012 | Lichtenbelt et al. |

(Continued)

FOREIGN PATENT DOCUMENTS

| CN | 101441615 A | 5/2009 |
| CN | 102541804 B | 4/2014 |

(Continued)

*Primary Examiner* — Ramesh B Patel
(74) *Attorney, Agent, or Firm* — Scully, Scott, Murphy & Presser, P.C.; Jason Sosa, Esq.

(57) ABSTRACT

A method, a system and a computer program product for reconfiguring hardware network topology including graphics processor units (GPU) and central processing unit (CPU) interconnectivity on or across compute nodes of a rackmount server. The re-configurability is based on detected thermal throttling or thermal hot spots when running workloads. For network re-configurability, a user can directly connect high-speed cable links between CPU/GPU connectors and between GPU/GPU connectors on a same PCB compute node, or across two PCB compute nodes as suggested by a control processor to avoid thermal and power hotspots when running the workload. The method recommends and generates a system map of the hardware network topology known to avoid/mitigate thermal throttling, and instructs a configuration of CPUs and GPUs such that GPUs are assigned to workloads at locations for mitigating thermal throttling based on detected thermal hot spots and power hot spots to optimize workload performance.

20 Claims, 12 Drawing Sheets

(56) References Cited

U.S. PATENT DOCUMENTS

| | | | | |
|---|---|---|---|---|
| 8,319,782 | B2* | 11/2012 | Casparian | G06T 1/20 |
| | | | | 345/502 |
| 9,772,971 | B2* | 9/2017 | Smith | G06F 7/76 |
| 10,275,493 | B1* | 4/2019 | Mostak | G06T 1/20 |
| 10,592,291 | B2* | 3/2020 | Breakstone | G06F 9/5061 |
| 2004/0226026 | A1 | 11/2004 | Glass et al. | |
| 2009/0024969 | A1 | 1/2009 | Chandra | |
| 2010/0217454 | A1 | 8/2010 | Spiers et al. | |
| 2011/0077795 | A1 | 3/2011 | Vangilder et al. | |
| 2012/0162234 | A1* | 6/2012 | Blinzer | G06T 1/20 |
| | | | | 345/501 |
| 2014/0195835 | A1* | 7/2014 | E. | G06F 1/3253 |
| | | | | 713/323 |
| 2016/0118121 | A1* | 4/2016 | Kelly | G06F 13/4282 |
| | | | | 710/301 |
| 2017/0054593 | A1 | 2/2017 | Borikar et al. | |
| 2017/0180272 | A1* | 6/2017 | Bernath | H04L 49/3054 |
| 2017/0249279 | A1 | 8/2017 | Lee et al. | |
| 2017/0300431 | A1 | 10/2017 | Su | |
| 2019/0370927 | A1* | 12/2019 | Frenkel | G06F 11/3612 |
| 2020/0065283 | A1* | 2/2020 | Jayaraman | G06F 13/4282 |

FOREIGN PATENT DOCUMENTS

| | | |
|---|---|---|
| CN | 104657317 | 5/2015 |
| CN | 105117170 A | 12/2015 |
| CN | 107632953 A | 1/2018 |

\* cited by examiner

RECONFIGURBLE CPU/GPU INTERCONNECT TO MITIGATE POWER/THERMAL THROTTLING

FIELD

This disclosure relates generally to high-speed workload processing architectures including multiple central processing units (CPUs) and graphics processing units (GPUs), and particularly to a novel method and system architecture to reconfigure GPUs with or without using high-speed switches to mitigate power/thermal throttling in configured topologies for running workloads.

BACKGROUND

Machine learning/deep learning workloads utilize GPUs to offload content and perform operations involving extremely-large amounts of data. The throughput of the interface between CPU and GPU, as well as GPU to GPU, is extremely significant and hence the latency is extremely important. Some current application workloads demand GPU to GPU traffic, which is enabled by either a PCI-e switch (in cases where the GPUs are endpoints) allowing for peer-to-peer (P2P) traffic without the involvement of the CPU, or a separate high speed link between the GPU and the CPU.

Moreover, for machine learning/deep learning workloads, rack-mount systems are increasingly being used in datacenters that include a hardware framework including slots or bays for mounting multiple computing machines (nodes) in a rack, such as network servers, routers switches or other network devices. While a rack-mount system typically includes a controller and cooling fans for implementing thermal control of the nodes, such as by removing heat, it is typical that, in the course of running programmed workloads, each node may not be heated the same way in the rack. Excessive power conduction and thermal hot spots may develop at one or more nodes, or parts of the node circuit motherboards, and may impact performance and/or decrease reliability of the computing rack network infrastructure.

SUMMARY

There is provided a re-configurable system architecture and corresponding method for producing flexible and cost-sensitive network hardware topologies in a rack-mount server system to mitigate and/or avoid thermal hot spots and excessive power conduction among rack-mounted compute nodes.

There is provided a re-configurable system architecture and corresponding method for producing flexible and cost-sensitive network architecture designs which are optimized to avoid/mitigate thermal hot spots and excessive power conduction for particular workloads.

There is provided a method and system architecture to reconfigure GPUs with or without the switches to design favorable latency and bandwidth hardware-based topologies to improve performance of workloads by avoiding/mitigating (or throttling) thermal hot spots and excessive power conduction at power supplies.

In one aspect, there is provided a configurable hardware network architecture for a rack-mount server comprising: a plurality of computing nodes, each node embodied as a printed circuit board (PCB) platform, and communicatively coupled through a backplane within a rack-mount server chassis; one or more power supplies electrically coupled to the plurality of computing nodes; one or more cooling elements within the rack-mount server chassis, each designed to provide cooling to a specific region within the rack-mount server chassis; one or more heat sensors placed within the rack-mount server chassis, and operable to detect temperatures from different regions and components with the rack-mount server chassis; and a chassis management module (CMM) for monitoring and directing workload between and within the plurality of computing nodes. Each computing node comprises: wired connections for routing signals between electronic devices, the electronic devices comprising multiple graphics processing units (GPUs) for carrying out first sets of operations, a central processing unit (CPU) for carrying out second sets of operations, and a memory storage associated with the CPU and GPUs; the CPU and each of the multiple the GPUs having an associated one or more high-speed connectors capable of providing communications at a first byte speed and available for cable-connection at or near a surface of the computing node, wherein the CPU can communicate directly with any of the multiple GPUs via respective associated high-speed connectors when the respective associated high-speed connectors are linked via an appropriate cable, and wherein each GPU can communicate directly with another GPU of the multiple GPUs via respective associated high-speed connectors when the respective associated high-speed connectors are linked via an appropriate cable; and wherein the CMM is configured to monitor various workloads performed and detect thermal hot spot conditions at one or more components within the computing node via one or more heat sensors, and to determine, for a user, cabling between high-speed connectors that would improve ability to balance workload and mitigate identified thermal hot spot conditions at one or more components within the PCB platform In a further aspect, there is provided a method of configuring a hardware network architecture for running a workload on one or more computing nodes communicatively coupled through a backplane within a rack-mount server chassis. The method comprises: determining, by a chassis management module (CMM), a hardware network topology based on the workload to be run at one or more computing nodes in the rack-mount server chassis, a computing node embodied as a Printed Circuit Board (PCB) platform, each computing node comprising: wired connections for routing signals between electronic devices, the electronic devices comprising multiple graphics processing units (GPUs) for carrying out first sets of operations, a central processing unit (CPU) for carrying out second sets of operations, and a memory storage associated with the CPU and GPUs; the CPU and each of the multiple the GPUs having an associated one or more high-speed connectors capable of providing communications at a first byte speed and available for cable-connection at or near a surface of the computing node, wherein the CPU can communicate directly with any of the multiple GPUs via respective associated high-speed connectors when the respective associated high-speed connectors are linked via an appropriate cable, and wherein each GPU can communicate directly with another GPU of the multiple GPUs via respective associated high-speed connectors when the respective associated high-speed connectors are linked via an appropriate cable. The method further comprises: monitoring, using one or more heat sensors placed within the rack-mount server chassis, temperatures from different regions and components with the rack-mount server chassis, the CMM configured to monitor various workloads performed and detect thermal hot spot conditions at one or more components within the computing node based on monitored temperatures; and based on the detected thermal hot spot conditions of one or more components at the hardware network topology of the node, re-configuring the hardware network topology by adding or subtracting one or more direct connected cable links between the CPU and GPU or between GPUs of the multiple GPUs on the same node or separate nodes in the rack-mount server chassis, and moving the workload or a workload portion to another location in the rack-based server chassis.

In a further aspect, there is provided a computer program product for performing operations. The computer program product includes a storage medium readable by a processing circuit and storing instructions run by the processing circuit for running a method. The methods are the same as listed above.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

Figure 1A:
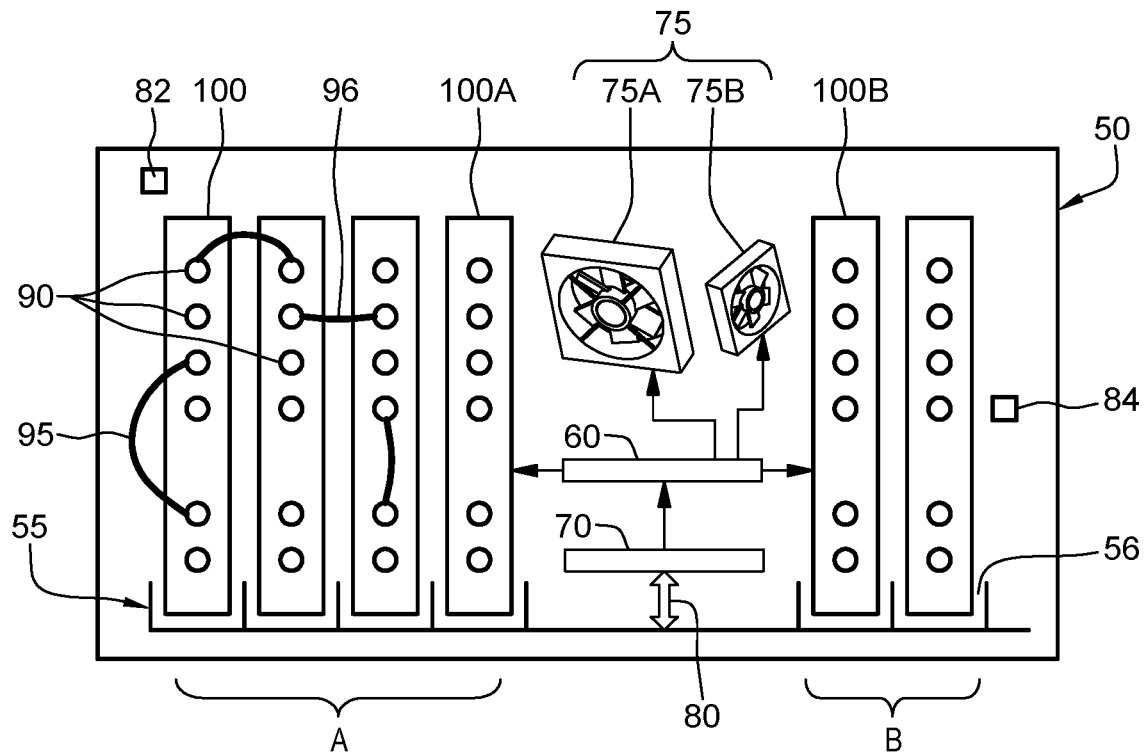
FIGS. 1A and 1B depict respective example configurations of a rack-mount based computing system employing multiple nodes and employing connections adapted to re-configure network topologies for mitigating/avoiding thermal hot spots and power spots when running workloads according to an embodiment of the invention.

The present disclosure relates to mitigating power/thermal throttling of rack-based or rack-mount server systems such as may be found in a computing datacenter. As shown in FIG. 1A, a rack-mounted system includes a hardware frame or chassis such as a rack 50 that includes back-plane connector 55 providing multiple mounting slots or bays 56, each slot configured to hold a hardware unit, i.e., a compute node or "blade", including a central processing unit (CPU), graphics processing unit (GPU) and associated memory and network input/output, that may be secured in the slot. In embodiments herein, each slot 56 is adapted to mount a CPU/GPU based server system 100, in particular, a single carrier or printed circuit board (PCB) assembly having a re-configurable network topology 100 such as described in commonly-owned, co-pending U.S. patent application Ser. No. 16/106,847 entitled "Reconfigurable Network Infrastructure," the whole contents and disclosure of which is incorporated by reference as if fully set forth herein.

As shown in FIG. 1A, in accordance with embodiments of the invention, the rack-mount system 50 includes both a cooling infrastructure and a power infrastructure within the chassis. In particular, the rack-mount system backplane 55 attaches one or more power supplies 60 for supplying power to the various node motherboards (carriers) and, in addition, for supplying power to one or more chassis cooling fans 75 implemented for cooling (i.e., removing heat from) the compute nodes 100 and providing an amount of thermal control to the rack. In particular, a chassis fan(s) 75 can be associated with a respective cooling "zone" in the rack, where the fan operates to cool specific motherboards in that specific zone. For example, as shown in FIG. 1A, cooling fan 75A may operate to cool nodes or blades in chassis zone "A" while cooling fan 75B may operate to cool nodes or blades in chassis zone "B". A chassis management module 70 ("CMM") includes a controller, such as a programmed processor, and provides the logic for controlling the turning on/off of fans 75 in a specific zone(s), increasing a speed of a fan in a specific zone, and/or controlling power conduction to one or more rack-mounted motherboards in order to mitigate/avoid thermal hot spots and excessive power conduction. In embodiments, a heat sensor system includes sensors 82, 84, and detects temperature/heat at a zone or at one or more components of a PCB board. A temperature sensor from one or more of the GPUs can be used in the detecting of temperature/heat as well.

In an embodiment, each node 100 may communicate with the chassis management module 70 to specify that node's particular power requirement to the chassis management module 70 and to indicate an amount of cooling that may be required to optimally run that workload. Communications between each reconfigurable compute node 100 and the chassis control module 70 occur via data and address bus connections 80 via the backplane 55. Typically, in response to communications from the nodes, chassis management module 70 will configure the rack nodes to run a particular workload(s) and configure/turn-on the fans and power supplies in particular zones.

In an embodiment, as shown in FIG. 1A, chassis management or control module 70 implements methods to facilitate a reconfiguring of hardware network topology of a rack-based server system of compute processing nodes in a manner so as to avoid thermal hot spots and excessive power conduction at the nodes. By providing details regarding specific workload and detected hotspot locations, based on the details from the CMM, the system permits a user to reconfigure connections to and between integrated circuits such as control processing units (CPUs) and graphics processing units (GPUs) defining a network topology on the single carrier 100 or among the rack-based platform of multiple carriers 100 to avoid thermal hot spots and power spots and improve performance of the configured CPU/GPU interconnects.

In embodiments, as shown in FIG. 1A, the rack mount server system 50 contains several nodes 100 of CPU/GPU based server systems 100 that is configurable to optimize running of particular workloads. In particular, each single carrier compute node 100 includes multiple connectors 90, each connector associated with a respective computing component, i.e., a CPU or GPU, or a switch, at the node. Each connector 90 is adapted to receive a complementary mating connector of a cable 95 having two connector mating ends used to interconnect compute components CPU/GPU/switch among a single carrier 100, or interconnect such components on separate carriers. In embodiments herein, methods are run at the rack controller 70 to specify cabling 95 connections between and among one or more CPUs/GPUs for optimally running particular workloads. For example, the cabling connections 95 are re-configurable connections in that they can connect different CPUs to CPUs, CPUs to GPUs and/or GPUs to GPUs of a single carrier or server node 100. Further, cabling 96 provides re-configurable connections between different CPUs to CPUs, CPUs to GPUs and/or GPUs to GPUs among/between multiple boards (nodes) 100 in the rack. In an embodiment, the several nodes 100 of CPU/GPU based server systems of a rack mount server system 50 are reconfigurable in accordance with the teachings of herein-incorporated co-pending U.S. patent application Ser. No. 16/106,847.

In accordance with embodiments herein, cabling 95, 96 are re-configurable to change a network topology in order to re-align the workload amongst CPUs/GPUs of the rack-based nodes 100. Such workload re-alignment achieved by re-configuring cable connections 95 at CPUs/GPUs amongst a single rack-based node 100 and/or by re-configuring cabling 96 between connectors at multiple rack-based node(s) 100 enable optimal workload processing operations from the standpoint of mitigating thermal hot spots in the rack, while in addition, saving power (and associated heat generation) by avoiding or minimizing use of particular cooling fans 75 that would otherwise be turned on when running typical workloads.

It is the case that while running a particular workload, a node may detect presence of a thermal hot spot, e.g., located at an isolated area such as a GPU, at the motherboard. For example, there may be maximum current drawn by a GPU from a single power supply by the networked components at a node which can generate excessive heat at that node. Typically, in conventional blade servers, the blade or node 100 will communicate the presence of a detected hot spot to the CMM 70, and the CMM 70 will conventionally react to this local event by determining a cooling zone in which the particular node is located in the rack, and take corrective action to ameliorate or mitigate the isolated thermal hot spot such as by turning on a new fan, increasing the speed of an existing fan, and/or by adding a new power supply to reduce/prevent an overdrawing of energy from a current overloaded power supply generating the heat at that zone.

However, in accordance with embodiments herein, rather than taking the known corrective actions to ameliorate or mitigate the isolated thermal hot spot at the zone such as by turning on a new fan, increasing the speed of an existing fan, or by adding a new power supply, the control management module 70 can initially recommend a specific network infrastructure or topology for running that workload that is known to optimally perform from a heat generating and power conducting standpoint for maximizing performance.

In an embodiment, upon booting up a specific workload to be run at a node in the chassis 50, the CMM 70 generates a message to configure a particular network topology including a specific cabling 95, 96 configuration, that can render workload operating conditions more optimal from a heat generating and power conducting standpoint for maximizing performance.

Alternatively, during operation, upon receiving a communication from a node 100 that has detected a thermal hot spot, the CMM 70 can suggest a different topology based on the hot spot seen and generate a message recommending a user to change a cabling configuration 95, 96, and/or recommending moving that workload to another node/zone in order to render workload operating conditions more optimal from a heat generating and power conducting standpoint for maximizing performance. For example, by re-configuring of the cable connections 95 and/or 96, a workload may be transferred to another CPU or GPU that is suitable for handling that workload at another node in the rack located at another cooling zone. For example, by cable reconfiguring, a workload may be moved to a node in a zone that is already "cooler", i.e., already has an operating cooling fan pointing to nodes in that zone. In this manner, the initial detected thermal hot spot will be mitigated due to moving the workload to that other cooler node/zone. Moreover, energy would be saved by avoiding the need to increase fan speed or turn on a new fan at the initial zone at which the workload is currently running.

Figure 1B:
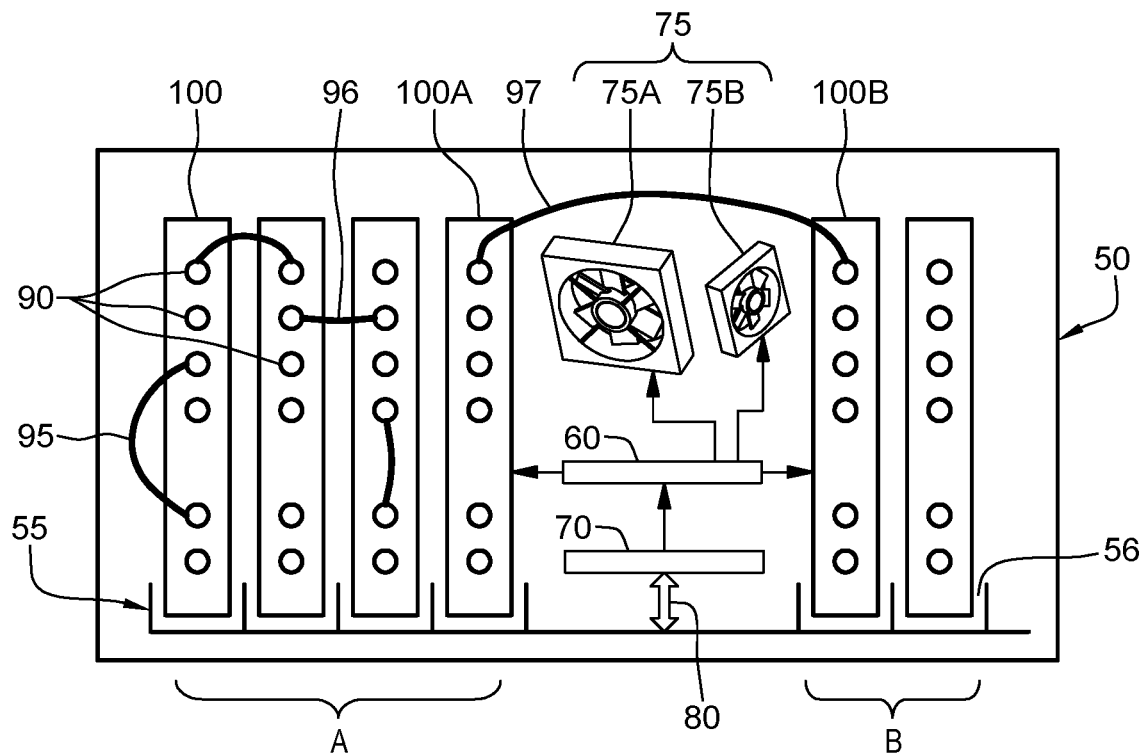

As an example, as shown in FIG. 1B, in response to receiving a message from a node 100A having detected a thermal hot spot condition at a CPU at that processing node running in zone A, the CMM 70 can generate a message providing this detail and recommend a re-configuring of a cable connection 97 from the node 100A to a particular connector associated with a CPU at another node that is capable to handle that particular workload and that is in a "cooler" zone that may run a cooling fan that currently provides a cooling margin that can mitigate additional heat generation in that zone. For instance, CMM 70 can determine that node 100B is currently in a "cooler" zone, e.g., zone B running cooling fan 75B and includes a CPU capable of handling that workload. Thus, the CMM 70 will generate a message for the user to physically re-configure the cabling 97 to move that workload to a CPU at node 100B in a zone B that is already "cooler" in order to move that thermal hot spot caused by the workload at the initial node/zone to this other cooler zone.

In this manner, the CMM 70 can avoid having to increase the fan speed of fan 75A at cooling zone A or avoid having to turn on a new fan at the initial zone A. Additionally, in this illustrative example, the CMM 70 can avoid having to turn on a new fan or increase a speed of a fan 75B already at the zone B which already points to the node 100B to which the workload has been moved by cable 97 reconfiguring.

Figure 2:
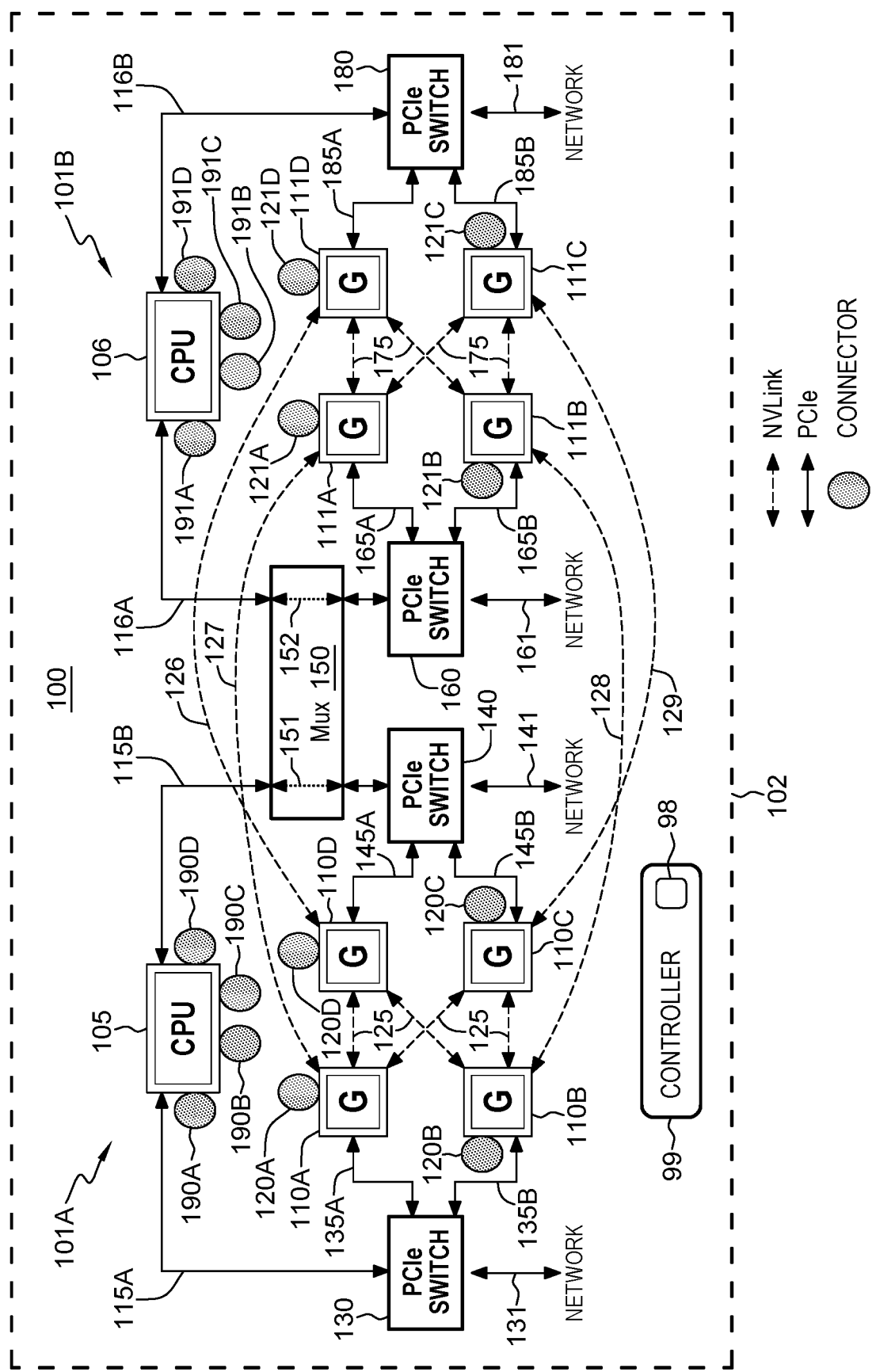
FIG. 2 shows an example configuration of a base CPU/GPU network architecture showing connections adapted for re-configuring network topologies on a compute node and/or between compute nodes in the rack-mount system of FIGS. 1A and 1B.

FIG. 2 shows an example configuration of a base CPU/GPU network architecture showing connections adapted for re-configuring network topologies on a compute node and/or between compute nodes in the rack-mount system of FIGS. 1A and 1B. In an example configuration, the re-configurable network topology 100 of FIG. 2 is included on a single carrier, e.g., a mother board or printed circuit board (PCB) 102, that includes, in a non-limiting embodiment, two clusters 101A, 101B of an electronic device, each cluster including a CPU and a cluster of GPUs, e.g., four GPUs that can each be used for graphics workloads, but are also used with a CPU(s) to carry out sets of operations to accelerate scientific, engineering and business software workloads. Although not shown, a GPU and CPU may be a processor node having its own associated memory, I/O, and networked connection.

The printed circuit board (PCB) 102 includes high-speed communication channels, wired connections, e.g., data bus lines, address bus lines, Input/Output (I/O) data lines, etc., and connectors for routing signals between GPUs of the GPU cluster or between a CPU and GPUs of the cluster along high-speed cable connections. One example of a high-speed cable is the wire-based NVLink® (reg. trademark of Nvidia Corp.) providing a communications protocol serial multi-lane near-range high-speed communication link. Such high-speed links include dedicated high-bandwidth point-to-point channels, e.g., enabling data communications at least at, but not limited to, 25 GB/s for data and control code transfers in processor systems between CPUs and GPUs and between GPUs. As shown, the single carrier 102 (or portion thereof) includes at least two host CPUs, e.g., a microprocessor 105 in cluster 101A and a single host CPU 106 in networking cluster 101B for carrying out respective control operations in each cluster for example. Cluster 101A further includes four graphics processing units (GPUs) 110A, . . . , 110D and cluster 101B also includes four graphics processing units (GPUs) 111A, . . . , 111D.

A further baseboard management controller or like control device 99 running boot code 98 for providing overall system boot operations for any network topology configured for running a workload using the reconfigurable architecture of FIG. 2 is also provided.

As further shown in FIG. 2, re-configurable network topology 100 further includes, at cluster 101A of the single mother board, a high-speed first Peripheral Component Interconnect Express (PCIe) Switch 130 for performing switching and point-to-point connection operations in network 100 and that includes dedicated high-speed PCIe serial communication connections (links) on or in the PCI board (i.e., PCIe channels with more limited bandwidth than NVlinks speed). PCIe switch 130 interfaces with an external high-speed network connection or memory via a PCI serial bus link 131 which can include a connection to a PCIe based NVME or Infiniband (IB) adapter (not shown). PCIe switch 130 includes on-board configurable PCIe serial connection 115A that connects the CPU 105 with switch 130. The switch 130 is further configurable to directly connect CPU 105 with GPUs 110A, 110B over respective dedicated high-speed PCIe serial communication links 135A, 135B.

Cluster 101A includes a second PCIe switch 140 for performing switching and point-to-point connecting operations in network 100 that includes a dedicated high-speed PCIe serial connection 141 to interface with another external high-speed network (not shown), and an on-board dedicated PCIe serial connection 115B to connect with the CPU 105. The switch is further configurable to directly connect CPU 105 with GPUs 110D, 110C over respective dedicated high-speed PCIe serial communication links 145A, 145B.

As further shown in FIG. 2, re-configurable network topology 100 further includes dedicated direct-direct high-speed GPU/CPU communication links 125 in or on the PCB 102 for connecting GPU's, and particularly, an on-board high-speed GPU/CPU communication links 125 directly connecting GPUs 110A and 110D, an on-board high-speed NVLink 125 directly connecting GPUs 110B and 110C, an on-board high-speed NVLink 125 directly connecting GPUs 110A and 110C and a high-speed GPU/CPU communication link 125 directly connecting GPUs 110B and 110D. As mentioned, an example of a high speed GPU/CPU communication link is NVlink or OPENCAPi (coherent accelerator processor interface).

Re-configurable network topology 100 further includes, at cluster 101B of the single mother board, a high-speed PCIe Switch 160 for performing switching and point-to-point connection operations in re-configurable network 100 and that includes an on-board dedicated high-speed PCIe serial connection 161 to interface with an external high-speed network (not shown). Further connected to PCIe switch 160 is a dedicated PCIe serial connection 116A to connect the switch 160 with the second CPU 106. The switch is further configurable to directly connect CPU 106 with GPUs 111A, 111B over respective dedicated high-speed PCIe serial communication links.

Cluster 101B includes a second PCIe switch 180 for performing switching and point-to-point point connecting operations in network 100 that includes a dedicated high-speed PCIe serial connection 181 to interface with an external high-speed network (not shown). A dedicated PCIe serial connection 116B connects switch 180 with the CPU 106. The switch 180 is further configurable to directly connect CPU 106 with GPUs 110D, 110C over respective dedicated high-speed PCIe serial communication links 185A, 185B.

As further shown in FIG. 2, re-configurable network topology 100 further includes on-board dedicated direct-direct high-speed GPU/CPU communication links 175 for connecting GPU's, and particularly, a high-speed GPU/CPU communication link 175 directly connecting GPUs 111A and 111D, a high-speed GPU/CPU communication link 175 directly connecting GPUs 111B and 111C, a high-speed GPU/CPU communication link 175 directly connecting GPUs 111A and 111C and a high-speed GPU/CPU communication link 175 directly connecting GPUs 111B and 111D.

Additionally shown in FIG. 2 is the provision of multiplexor circuit 150 which is programmable to provide a first multiplexed connection 151 for connecting the CPU 105 to the PCIe Switch 140 in cluster 101A, e.g., through PCIe connection link 115B. Similarly, multiplexor circuit 150 is programmable to provide a second multiplexed connection 152 for connecting the CPU 106 to the high-speed PCIe Switch 160 in cluster 101B, e.g., through PCIe connection link 116A, to enable direct-direct communication with GPUs 111A, 111B over respective PCIe communication links.

As further shown in FIG. 2, reconfigurable network 100 further includes cross-cluster high-speed GPU/CPU communication links on or in PCB 102 for directly connecting a GPU of one cluster 101A to a corresponding GPU of another cluster101B. For example, a dedicated cross-cluster high-speed GPU/CPU communication link 126 directly connects GPU 110A of cluster 101A to GPU 111A of cluster 101B; a dedicated cross-cluster high-speed GPU/CPU communication link 127 directly connects GPU 110D of cluster 101A to GPU 111D of cluster 101B; a dedicated cross-cluster high-speed GPU/CPU communication link 128 directly connects GPU 110B of cluster 101A to GPU 111B of cluster 101B; and dedicated cross-cluster high-speed GPU/CPU communication link 129 directly connects GPU 110C of cluster 101A to GPU 111C of cluster 101B.

Reconfigurability in network topology 100 is enabled by the provision of the physical high-speed GPU/CPU communication link (e.g., NVLink) connectors which are provided on the PCB platform 102 that enable direct point-to-point cabling (e.g. using high-speed GPU/CPU communication link cables and corresponding mating hardware connectors) for connecting two GPUs within a cluster or for connecting GPUs within a cluster to the CPU of that cluster. A network topology is re-architected based on a workload requirement and a desired thermal hot spot mitigation by providing different direct connections using the high-speed GPU/CPU communication link cables connections that connect to respective high-speed connectors.

As shown in FIG. 2, for example, in one embodiment, each GPU 110A, ..., 110D of cluster 101A has a respective physical high-speed GPU/CPU communication link connector 120A, ..., 120D situated on the motherboard in a manner configured to enable high-speed GPU/CPU communication link connections using high-speed cable to a graphics processing unit in that cluster having a corresponding physical connector. Likewise, each GPU 111A, ..., 111D of cluster 101B has a respective physical connector 121A, ..., 121D situated on the motherboard 102 in a manner so as for directly connecting a high-speed cable to enable configurable high-speed GPU/CPU communication link connections to a graphics processing unit connector of a GPU within that cluster.

In the embodiment depicted in FIG. 2, the high-speed GPU/CPU communication links of the CPU 105 are shown unconnected.

In the embodiment depicted, the CPU 105 is shown having four associated high-speed connectors 190A, 190B, 190C and 190D which may be cabled to provide direct high-speed communications with a respective physical high-speed GPU/CPU communication link connector 120A, ..., 120D of GPUs 110A, ..., 110D of the cluster 101A at or near a surface of the PCB 102. Alternately or in addition, all connectors of the board 102 may be found at an edge of the PCB so that the connector at the edge is exposed and accessible via the rack mount server system. Similarly, the CPU 106 is shown having four associated high-speed connectors 191A, 191B, 191C and 191D which may be cabled to provide direct high-speed communications with a respective physical high-speed GPU/CPU communication link cable connector 121A, ..., 121D of respective GPUs 111A, ..., 111D of the cluster 101B at or near a surface of the PCB connections platform 102. Depending upon the implementation, the connectors can be at the PCB edge and active re-driver cables can be used to connect to the next node.

In embodiments, network topology 100 at the rack-mounted compute node 100 shown in FIG. 2 can be two separate carriers, e.g., each carrier including a respective one cluster 101A, 101B, and can constitute two different compute nodes, e.g., nodes 100A, 100B in the rack system 50 of FIGS. 1A and 1B. Multiple types of network topologies are configurable to optimally run workloads that avoid thermal hot spot and excessive power conduction by configuring different cabling connections between different CPUs to CPUs, CPUs to GPUs and/or GPUs to GPUs between the two separate carriers (compute nodes) in order to achieve optimal performance when running workloads.

Figure 3:
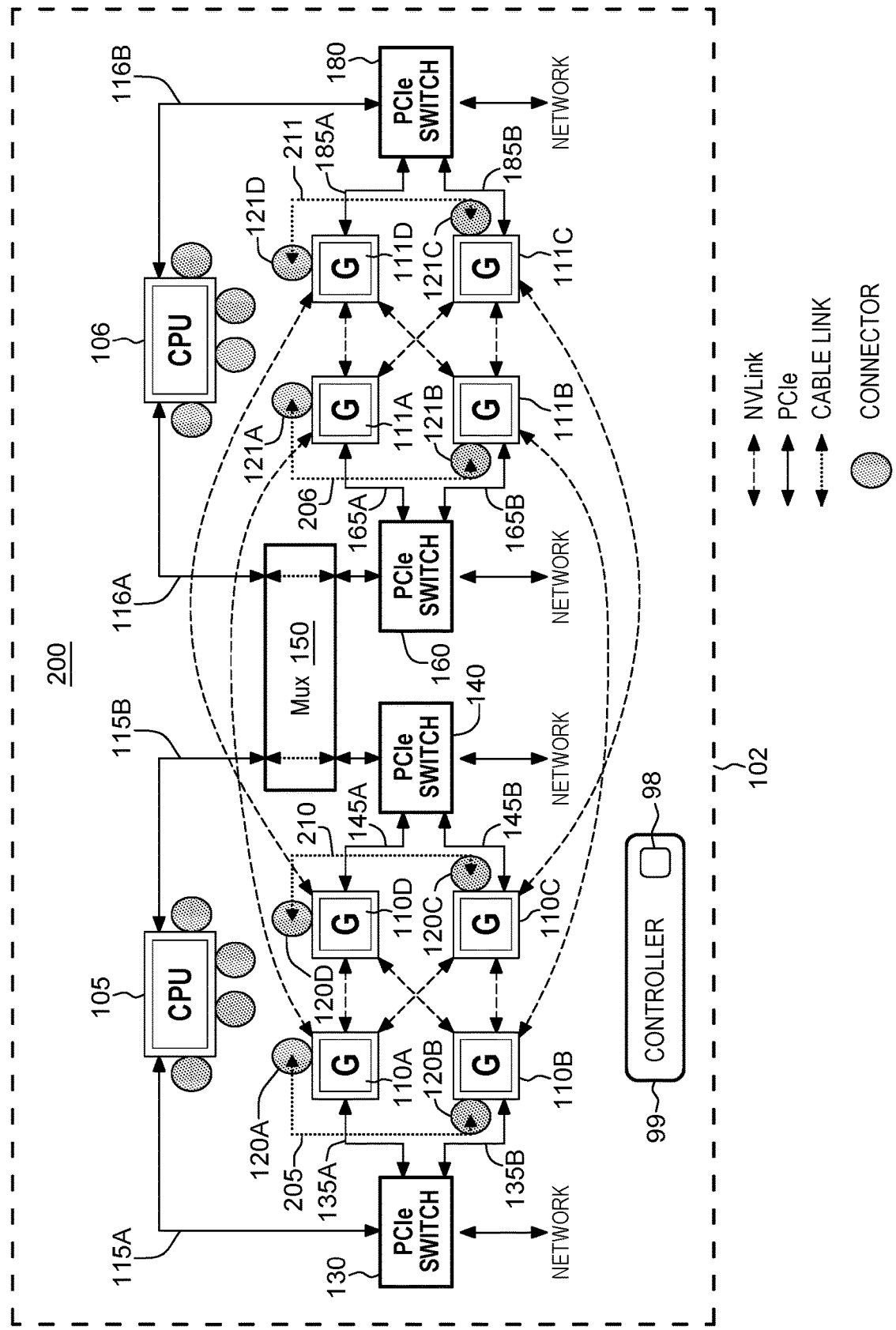
FIG. 3 depicts an example type of re-configured network topology on a compute node or between two nodes using the reconfigurable base network architecture of FIG. 2.

FIG. 3 depicts an example type of re-configured network topology 200 on a compute node or between two nodes using the reconfigurable base network architecture of FIG. 2. In the example network topology 200, there is provided an additional high speed GPU/CPU communication link cable connection 205 connected at one end to connector 120A of GPU 110A and at the other end to connector 120B of GPU 110B of cluster 101A enabling high-speed data transfers between GPUs 110A, 110B. In an embodiment, besides conducting data transfer between GPUs 110A, 110B via a connected high-speed GPU/CPU communication link 205, PCIe switch 130 is configurable to provide an additional parallel coherent or sideband links that increase bandwidth for enabling data transfer between GPU components 110A, 110B in parallel with high-speed GPU/CPU communication link 205 by serially connecting PCIe channels 135A, 135B via connecting ports of switch 130. Alternatively, or in addition, in a further embodiment, an additional high speed high-speed GPU/CPU communication link cable connection 210 may be added to connect at one end to connector 120D of GPU 110D and at the other end to connector 120C of GPU 110C of cluster 101A enabling high-speed data transfers between GPUs 110C, 110D. In an embodiment, besides conducting data transfer between GPUs 110D, 110C via a connected high-speed cable, e.g., NVlink 210, PCIe switch 130 is configurable to provide an additional parallel coherent link to increase bandwidth for enabling data transfer between GPU components 110D, 110C in parallel with NVlink 210 by serially connecting PCIe channels 145A, 145B via connecting ports of switch 140.

FIG. 3 further depicts, in the example network topology 200, alternative or additional embodiments, that provide a high-speed GPU/CPU communication link cable connection 206 at one end to connector 121A of GPU 111A and at the other end to connector 121B of GPU 111B of cluster 101B to enable a direct high-speed point-to-point connection enabling high-speed data transfers between these two GPUs 111A, 111B. In an embodiment, besides conducting data transfer between GPUs 111A, 111B via a connected high-speed GPU/CPU communication link 206, PCIe switch 160 is configurable to provide an additional parallel sideband link to increase bandwidth for enabling data transfer between GPU components 111A, 111B in parallel with NVlink 206 by serially connecting PCIe channels 165A, 165B via connecting ports of switch 160. Alternatively, or in addition, in a further embodiment, an additional high-speed GPU/CPU communication link cable connection 211 may be added to connect at one end to connector 121D of GPU 111D and at the other end to connector 121C of GPU 111C of cluster 101B enabling high-speed data transfers between GPUs 111C, 111D. In an embodiment, besides conducting data transfer between GPUs 111D, 111C via a connected high-speed GPU/CPU communication link 211, PCIe switch 180 is configurable to provide an additional parallel coherent link to increase bandwidth for enabling data transfer between GPU components 111D, 111C in parallel with high-speed GPU/CPU communication link 211 by serially connecting PCIe channels 185A, 185B via connecting ports of switch 180.

In the embodiment depicted in FIG. 3, the high-speed GPU/CPU communication links of the CPU 105 may remain unconnected.

Figure 4:
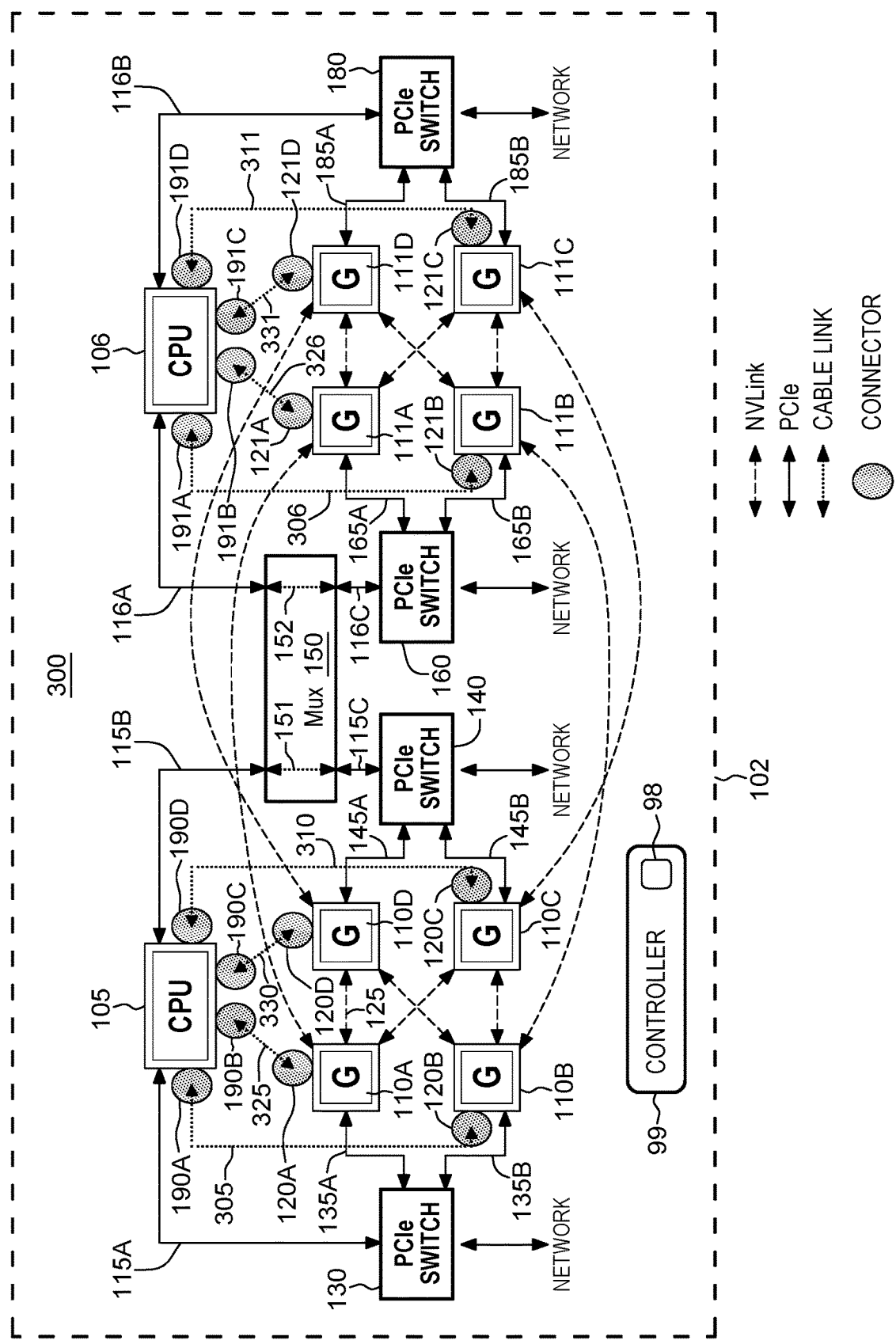
FIG. 4 depicts a further example type of re-configured network topology on a compute node or between two nodes using the reconfigurable infrastructure for configuring base network architecture of FIG. 2.

FIG. 4 depicts a further example type of re-configured network topology 300 on a compute node or between two nodes using the reconfigurable base network architecture of FIG. 2. The example re-configured network topology 300 includes an additional high-speed GPU/CPU communication link cable connection 305 connected at one end to connector 190A of CPU 105 and at the other end to connector 120B of GPU 110B of cluster 101A enabling high-speed data transfers between CPU 105 and GPU 110B. In an embodiment, besides conducting data transfer between CPU 105 and GPU 110B via a connected high-speed GPU/CPU communication link 305, PCIe switch 130 is configurable to provide an additional parallel coherent link to increase bandwidth for enabling further high-speed data transfer between CPU 105 and GPU 110B components in parallel with high-speed GPU/CPU communication link 305 by serially connecting PCIe channels 115A and 135B via connecting ports of switch 130. Alternatively, or in addition, in a further embodiment, an additional high-speed GPU/CPU communication link cable connection 310 may be added to connect at one end to connector 190D of CPU 105 and at the other end to connector 120C of GPU 110C of cluster 101A enabling high-speed data transfers between CPU 105 and GPU 110C. In an embodiment, besides conducting data transfer between CPU 105 and GPU 110C via a connected high-speed cable connection 310, both PCIe switch 140 and multiplexor 150 are configurable to provide an additional parallel sideband link to increase bandwidth for enabling high-speed PCIe data transfer between CPU 105 and GPU 110C in parallel with high-speed GPU/CPU communication link 310. To configure this additional parallel sideband link, the multiplexor 150 is activated to provide a serial connection at 151 between PCIe channel 115B and a PCIe channel 115C between the multiplexor 150 and switch 140. The switch 140 is activated to provide a high-speed PCIe serial connection between the channel 115C and the channel 145B via connecting ports of switch 140 with connections 115B, 151, 115C and 145B established to form the sideband link to increase bandwidth for conducting additional parallel data transfer between CPU 105 and GPU 110C.

In alternate or additional embodiment, FIG. 4 depicts an additional high-speed GPU/CPU communication link cable connection 325 connected at one end to connector 190B of CPU 105 and at the other end to connector 120A of GPU 110A of cluster 101A enabling high-speed data transfers between CPU 105 and GPU 110A. In an embodiment, besides conducting direct high-speed data transfers between CPU 105 and GPU 110A via a connected high-speed GPU/CPU communication link 325, PCIe switch 130 is configurable to provide an additional parallel coherent link to increase bandwidth for enabling further high-speed data transfer between CPU 105 and GPU 110A components in parallel with high-speed GPU/CPU communication link 325 by activating PCIe switch 130 to serially connect PCIe channels 115A and 135A via connecting ports of switch 130.

In alternate or additional embodiment, FIG. 4 depicts an additional high-speed GPU/CPU communication link cable connection 330 connected at one end to connector 190C of CPU 105 and at the other end to connector 120D of GPU 110D of cluster 101A enabling high-speed data transfers between CPU 105 and GPU 110D. In an embodiment, besides conducting data transfer between CPU 105 and GPU 110D via a connected high-speed cable 330, both PCIe switch 140 and multiplexor 150 are configurable to provide an additional parallel sideband link to increase bandwidth for enabling high-speed PCIe data transfer between CPU 105 and GPU 110D in parallel with high-speed GPU/CPU communication link 330. To configure this additional parallel side-band link, the multiplexor 150 is activated to provide a serial connection at 151 between PCIe channel 115B and a PCIe channel 115C between the multiplexor 150 and switch 140. The switch 140 is activated to provide a high-speed PCIe serial connection between the channel 115C and the channel 145A via connecting ports of switch 140 with connections 115B, 151, 115C and 145A established to form the side-band link for conducting additional parallel data transfer between CPU 105 and GPU 110D.

FIG. 4 depicts in the further example re-configured network topology 300 corresponding to the base network architecture of FIG. 2, an additional or alternative high-speed GPU/CPU communication link cable connection 306 connected at one end to connector 191A of CPU 106 and at the other end to connector 121B of GPU 111B of cluster 101B enabling high-speed data transfers between CPU 106 and GPU 111B. In an embodiment, besides conducting data transfer between CPU 106 and GPU 111B via a connected high-speed GPU/CPU communication link 306, both PCIe switch 160 and multiplexor 150 are configurable to provide an additional parallel side-band link for enabling high-speed PCIe data transfer between CPU 106 and GPU 111B in parallel with high-speed GPU/CPU communication link 306. To configure this additional parallel side-band link, the multiplexor 150 is activated to provide a serial connection at 152 between PCIe channel 116A and a PCIe channel 116C between the multiplexor 150 and switch 160. The switch 160 is activated to provide a high-speed PCIe serial connection between the channel 116C and the channel 165B via connecting ports of switch 160 with connections 116A, 152, 116C and 165B established to form the side-band link for conducting additional parallel data transfer between CPU 105 and GPU 111B.

Alternatively, or in addition, in a further embodiment, an additional high-speed GPU/CPU communication link cable connection 311 may be added to connect at one end to connector 191D of CPU 106 and at the other end to connector 121C of GPU 111C of cluster 101B enabling high-speed data transfers between CPU 106 and GPU 111C. In an embodiment, besides conducting data transfer between CPU 106 and GPU 111C via a connected high-speed GPU/CPU communication link 311, PCIe switch 180 is configurable to provide an additional parallel side-band link for enabling further high-speed data transfer between CPU 106 and GPU 111C components in parallel with high-speed GPU/CPU communication link 311 by activating PCIe switch 180 to serially connect PCIe channels 116B and 185B via connecting ports of switch 180.

In an alternate or additional embodiment, FIG. 4 depicts an additional high-speed GPU/CPU communication link cable connection 326 connected at one end to connector 191B of CPU 106 and at the other end to connector 121A of GPU 111A of cluster 101B enabling high-speed data transfers between CPU 106 and GPU 111A. In an embodiment, besides conducting data transfer between CPU 106 and GPU 111A via a connected high-speed GPU/CPU communication link 326, both PCIe switch 160 and multiplexor 150 are configurable to provide an additional parallel side-band link for enabling high-speed PCIe data transfer between CPU 106 and GPU 111A in parallel with high-speed GPU/CPU communication link 326. To configure this additional parallel side-band link, the multiplexor 150 is activated to provide a serial connection at 152 between PCIe channel 116A and a PCIe channel 116C between the multiplexor 150 and switch 160. The switch 160 is activated to provide a high-speed PCIe serial connection between the channel 116C and the channel 165A via connecting ports of switch 160 with connections 116A, 152, 116C and 165A established to form the side-band link for conducting additional parallel data transfer between CPU 106 and GPU 111A.

In an alternate or additional embodiment, FIG. 4 depicts an additional high speed high-speed GPU/CPU communication link cable connection 331 connected at one end to connector 191C of CPU 106 and at the other end to connector 121D of GPU 111D of cluster 101B enabling high-speed data transfers between CPU 106 and GPU 111D. In an embodiment, besides conducting direct high-speed data transfers between CPU 106 and GPU 111D via a connected high-speed cable high-speed GPU/CPU communication link 331, PCIe switch 180 is configurable to provide an additional parallel side-band link for enabling further high-speed data transfer between CPU 106 and GPU 111D components in parallel with high-speed GPU/CPU communication link 331 by activating PCIe switch 180 to serially connect PCIe channels 116B and 185A via connecting ports of switch 180.

Figure 5:
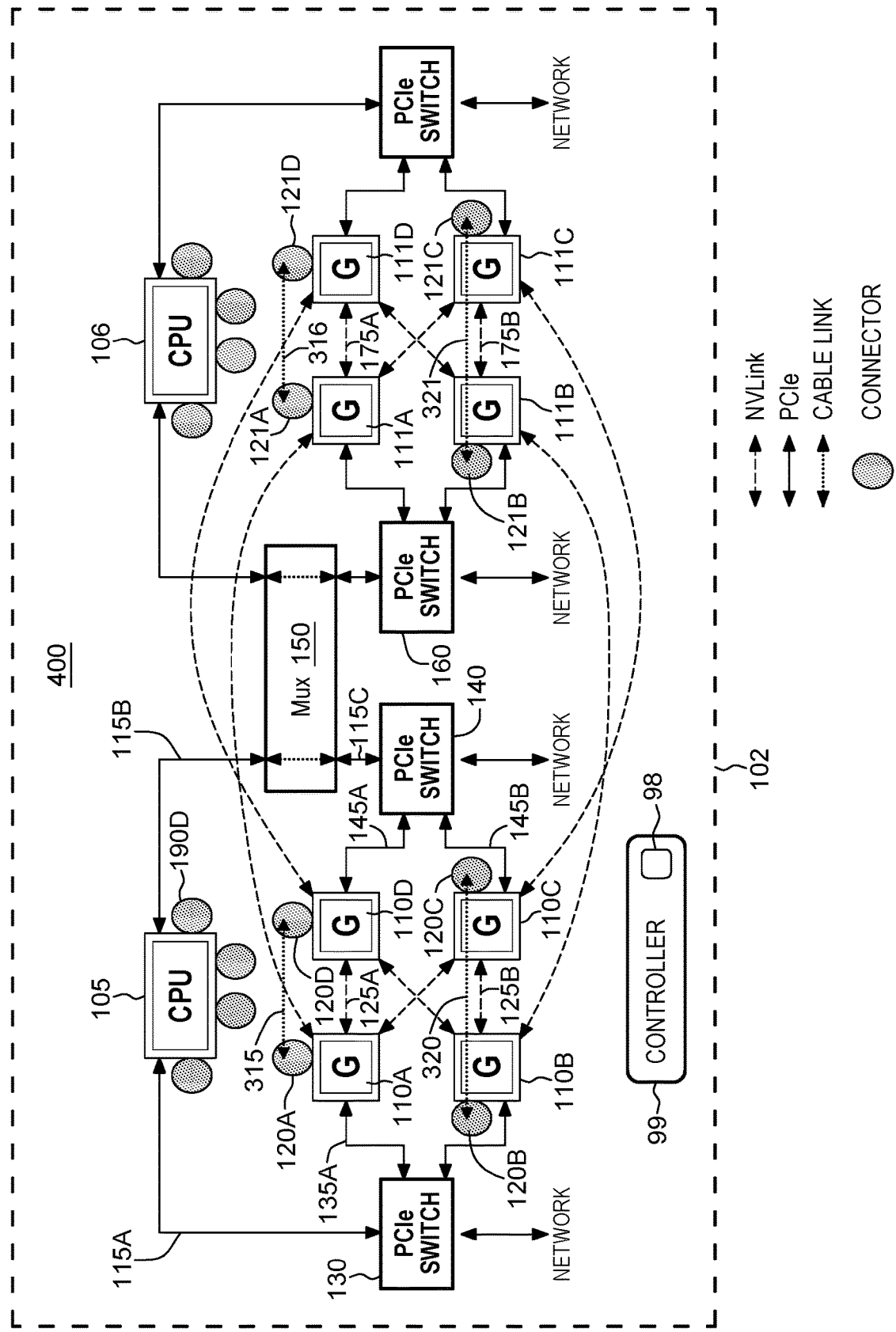
FIG. 5 depicts another example type of re-configured network topology on a compute node or between two nodes using the reconfigurable base network architecture of FIG. 2.

FIG. 5 depicts another example type of re-configured network topology 400 on a compute node or between two nodes using the reconfigurable base network architecture of FIG. 2. In the re-configured network topology 400, an additional high-speed GPU/CPU communication link cable connection 315 is connected at one end to connector 120A of GPU 110A and at the other end to connector 120D of GPU 110D of cluster 101A enabling additional high-speed data transfers between GPU 110A and GPU 110D. This can constitute a side-band high-speed NVlink cable connection in parallel with on-board dedicated high-speed GPU/CPU communication link 125A enabling data transfers between GPU 110A and GPU 110D.

In a further alternative or additional embodiment, the network topology 400 may be re-configured to include a further high-speed GPU/CPU communication link cable connection 320 connected at one end to connector 120B of GPU 110B and at the other end to connector 120C of GPU 110C of cluster 101A enabling additional high-speed data transfers between GPU 110B and GPU 110C. This can constitute a side-band high-speed GPU/CPU communication link cable connection in parallel with on-board dedicated high-speed GPU/CPU communication link 125B enabling further data transfers between GPU 110B and GPU 110C.

In the further example re-configured network topology 400 of FIG. 5, it is possible to further provide an additional high-speed GPU/CPU communication link cable connection 316 connected at one end to connector 121A of GPU 111A and at the other end to connector 121D of GPU 111D of cluster 101B enabling additional high-speed data transfers between GPU 111A and GPU 111D. This can constitute a side-band or coherent high-speed GPU/CPU communication link cable connection in parallel with on-board dedicated high-speed GPU/CPU communication link 175A enabling parallel data transfers between GPU 111A and GPU 111D.

In a further alternative or additional embodiment, the network topology 400 may be re-configured to include a further high-speed GPU/CPU communication link cable connection 321 connected at one end to connector 121B of GPU 111B and at the other end to connector 121C of GPU 111C of cluster 101B enabling additional high-speed data transfers between GPU 111B and GPU 111C. This can constitute a side-band or a coherent high-speed GPU/CPU communication link cable connection in parallel with on-board dedicated high-speed GPU/CPU communication link 175B enabling further data transfers between GPU 111B and GPU 111C.

Figure 6:
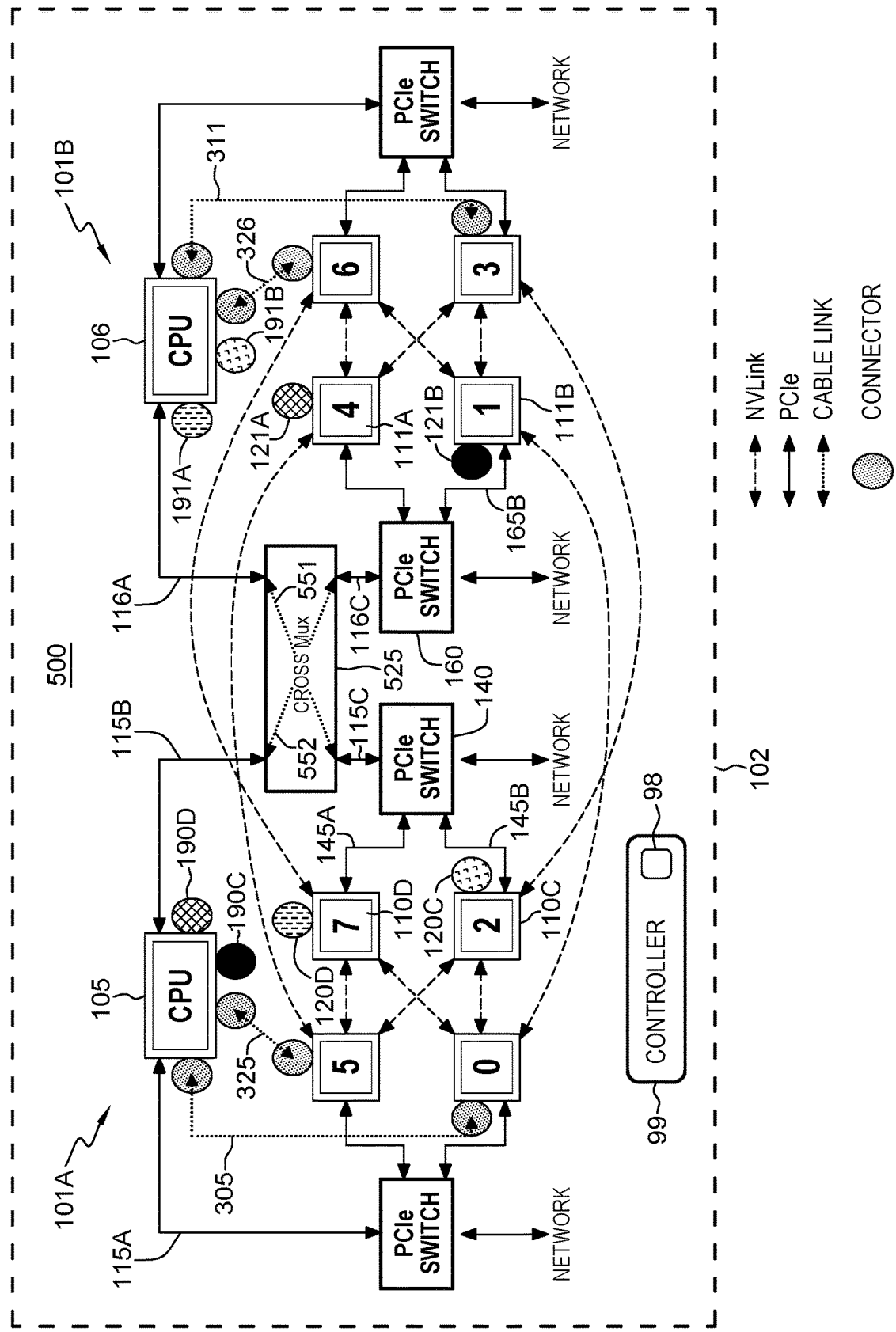
FIG. 6 illustrates yet a further example type of re-configured network topology on a compute node or between two nodes using the reconfigurable base network architecture of FIG. 2 and employing a cross-switching multiplexor for connecting two GPU clusters.

FIG. 6 illustrates yet a further example type of re-configured network topology on a compute node or between two nodes using the reconfigurable base network architecture of FIG. 2 and employing a cross-switching multiplexor for connecting two GPU clusters. The embodiment of FIG. 6 includes the same CPU and GPU clusters of devices and respective high-speed GPU/CPU communication links, e.g., high-speed Nvidia® NVLink connectors. In FIG. 6 are depicted examples of various configurations of direct high-speed GPU/CPU communication link connections enabling data transfers between a processing device of cluster 101A and a processing device of cluster 101B. The use of cross-multiplexing switch 525 permits additional high-speed PCIe direct side-band links between the connected elements.

For example, one configurable direct connection can include a high-speed GPU/CPU communication link cable connection (not shown) between connector 190D of CPU 105 and connector 121A of GPU 111A of cluster 101B to enable high-speed data transfer between those elements. A corresponding side-band link may be formed by activating PCIe switch 160 and cross-switching multiplexor 525 to enable a direct connection of PCIe channels between GPU 111A and CPU 105 including the activating of switch 160 for connecting of PCIe channels 165A and 116C and the activating of cross-switching multiplexor 525 for connecting link 116C and 115B connections through multiplexed connection 552.

Another configurable direct connection can include a high-speed GPU/CPU communication link cable connection (not shown) between connector 191B of CPU 106 and connector 120C of GPU 110C of cluster 101A to enable high-speed data transfer between those elements. A corresponding side-band link parallel to this connection may be formed by activating PCIe switch 140 and cross-switching multiplexor 525 to enable a direct connection of PCIe channels between GPU 110C and CPU 106 including the activating of PCIe switch 140 for connecting of PCIe channels 145B and 115C and the activating of cross-switching multiplexor 525 for connecting link 115C and 116A connections through multiplexed connection 551.

Another configurable direct connection can include a high-speed GPU/CPU communication link cable connection (not shown) between connector 191A of CPU 106 and connector 120D of GPU 110D of cluster 101A to enable high-speed data transfer between those elements. A corresponding side-band link parallel to this connection may be formed by activating PCIe switch 140 and cross-switching multiplexor 525 to enable a direct connection of PCIe channels between GPU 110D and CPU 106 including the activating of switch 140 for connecting of PCIe channels 145A and 115C and the activating of cross-switching multiplexor 525 for connecting link 115C and 116A connections through multiplexed connection 551.

Another configurable direct connection can include a high-speed GPU/CPU communication link cable connection (not shown) between cable connector 190C of CPU 105 and connector 121B of GPU 111B of cluster 101B to enable high-speed data transfer between those elements. A corresponding side-band link parallel to this connection may be formed by activating PCIe switch 160 and cross-switching multiplexor 525 to enable a direct connection of PCIe channels between GPU 111B and CPU 105 including the activating of switch 160 for connecting of PCIe channels 165B and 116C and the activating of cross-switching multiplexor 525 for connecting link 116C and 115B connections through multiplexed connection 552.

Figure 7:
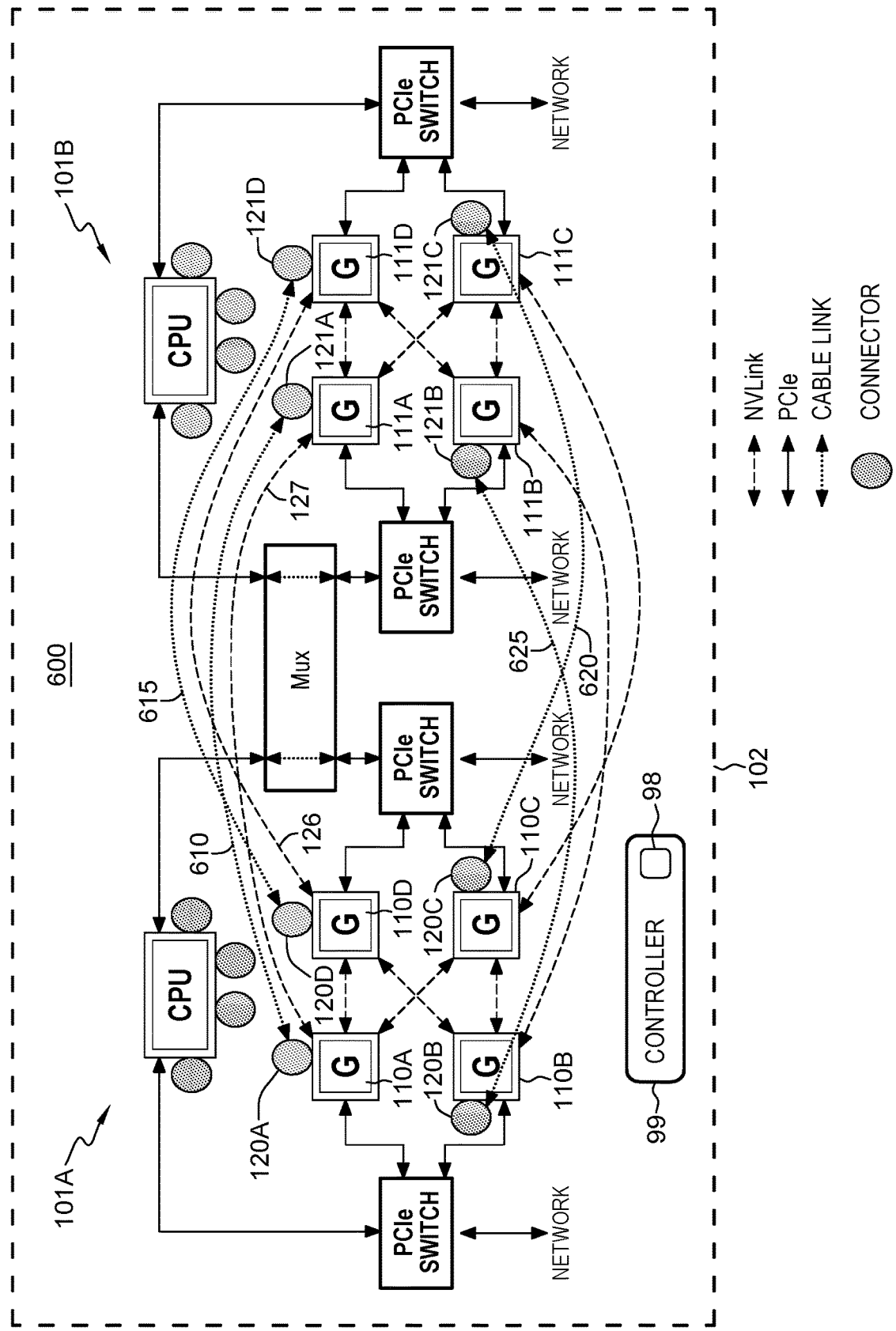
FIG. 7 illustrates still a further example type of re-configured network topology on a compute node or between two nodes using the reconfigurable base network architecture of FIG. 2.

FIG. 7 illustrates still a further example type of re-configured network topology 600 on a compute node or between two nodes using the reconfigurable base network architecture of FIG. 2. FIG. 7 includes the same CPU and GPU clusters of devices and respective on-board high-speed GPU/CPU communication link connectors. In FIG. 7 are depicted further examples of various configurations of direct high-speed GPU/CPU communication link cable connections enabling high-speed data transfers between a processing device of cluster 101A and a processing device of cluster 101B.

For example, one configurable direct connection can include a high-speed GPU/CPU communication link cable 610 connected between connector 120A of GPU 110A in cluster 101A and high-speed GPU/CPU communication link cable connector 121A of GPU 111A in cluster 101B. Similarly, a configurable direct high-speed connection can include a high-speed GPU/CPU communication link cable connection 615 between connector 121D of GPU 111D in cluster 101B and high-speed GPU/CPU communication link cable connector 120D of GPU 110D in cluster 101A. Similarly, a configurable direct high-speed connection can include a high-speed GPU/CPU communication link cable connection 620 between connector 121C of GPU 111C in cluster 101B and a high-speed GPU/CPU communication link cable connector 120C of GPU 110C in cluster 101A. Further, a configurable direct high-speed connection can include a high-speed GPU/CPU communication link cable connection 625 between connector 121B of GPU 111B in cluster 101B and a high-speed GPU/CPU communication link cable connector 120B of GPU 110B in cluster 101A.

Figure 8:
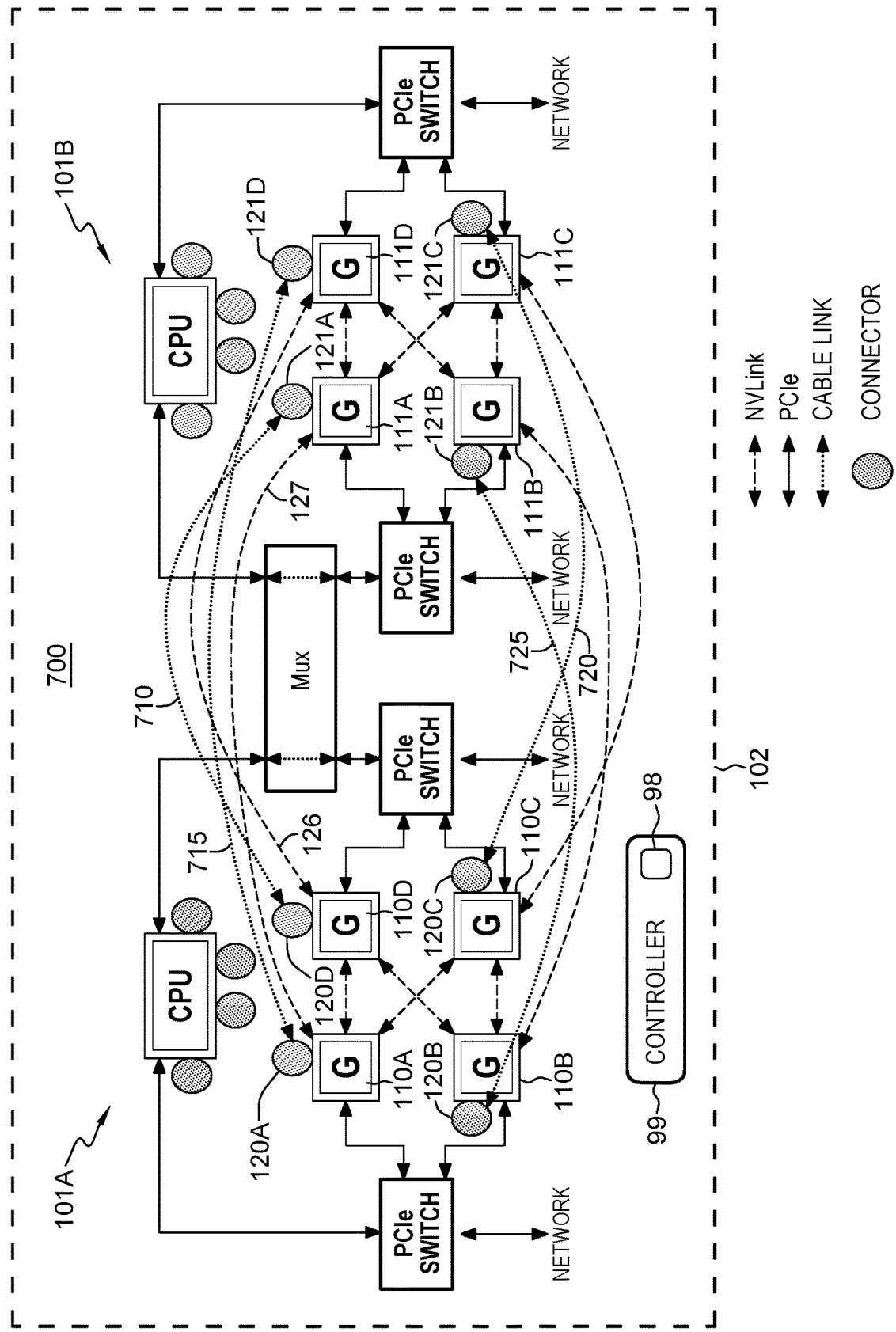
FIG. 8 illustrates an even further type of re-configured network topology on a compute node or between two nodes using the reconfigurable base network architecture of FIG. 2.

FIG. 8 illustrates an even further type of re-configured network topology 700 on a compute node or between two nodes using the reconfigurable base network architecture of FIG. 2. The embodiment depicted in FIG. 8 includes the same CPU and GPU clusters of devices and respective on-board high-speed GPU/CPU communication link connectors. In FIG. 8 are depicted further examples of various configurations of direct high-speed GPU/CPU communication link cable connections enabling high-speed data transfers between a processing device of cluster 101A and a processing device of cluster 101B.

For example, one configurable direct connection can include a high-speed GPU/CPU communication link cable 710, e.g., an NVLink, connected between connector 120D of GPU 110D in cluster 101A and NVLink cable connector 121A of GPU 111A in cluster 101B. Similarly, a configurable direct high-speed connection can include a high-speed GPU/CPU communication link cable connection 715 between connector 121D of GPU 111D in cluster 101B and high-speed GPU/CPU communication link cable connector 120A of GPU 110A in cluster 101A. Similarly, a configurable direct high-speed connection can include an NVLink cable connection 720 between connector 121C of GPU 111C in cluster 101B and a high-speed GPU/CPU communication link, e.g., NVLink, cable connector 120C of GPU 110C in cluster 101A. Further, a configurable direct high-speed connection can include an NVLink cable connection 725 between connector 121B of GPU 111B in cluster 101B and NVLink cable connector 120B of GPU 110B in cluster 101A.

In further embodiments, arrays of multiple re-configurable network architecture motherboards each, for example, having a same mechanical physical and thermal layout, may be employed in the rack-mounted systems each singularly or in combination with ability to configure and/or reconfigure the architecture by interconnecting CPU and GPU processing nodes using cable links on same or different motherboards. For example, the embodiments shown in FIGS. 2-8 depict types of re-configurable connections of different CPUs to CPUs, CPUs to GPUs and/or GPUs to GPUs and high-speed switches provided on a single computing node carrier or multiple nodes carriers in a rack-mount server system. For example, cabling 97 can provide re-configurable connections between different CPUs to CPUs, CPUs to GPUs and/or GPUs to GPUs between multiple boards (nodes) such nodes 100A, 100B in the rack-mount system 50 in order to achieve optimal performance by mitigating thermal hot spots and/or excessive power conduction.

Figure 9:
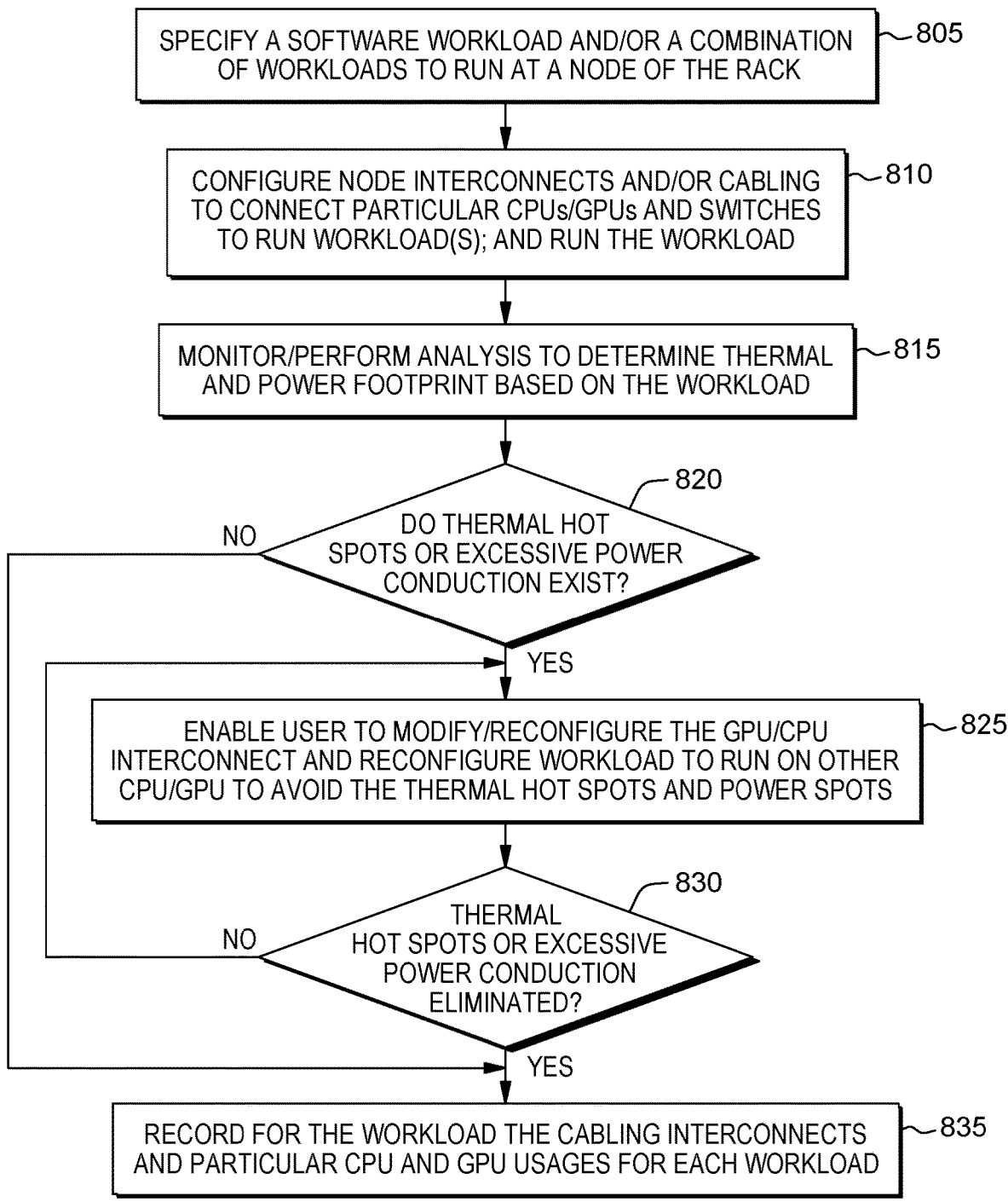
FIG. 9 shows a method for associating an optimal hardware network topology over one or more rack compute nodes for a particular workload run by a CPU that mitigates/avoids thermal and power hot spots in accordance with an embodiment.

FIG. 9 depicts a method 800 for determining optimal network topology configuration amongst one or more compute nodes at the rack system 50 depending upon workload types run at the nodes 100 and corresponding identified and learned thermal requirements. In an embodiment, the method 800 is run to determine areas of the computing node(s) having components that operate on a particular workload(s) and determine a corresponding network topology configuration including any cabling connections for configuration at the node(s) that mitigate/avoid any thermal hot spot at that area. Over time, based on running various types of workloads, and monitoring performance and obtaining thermal and power conducting measures while running a workload, an optimal network topology is learned and developed for a particular workload such that the operating components perform optimally by mitigating/avoiding thermal hot spots or excessive power conduction of any one power supply.

In an embodiment, a workload run may be mapped to the particular network topology known to be optimal from a performance standpoint by avoiding thermal and power conduction issues. A map or table is developed over time that includes a mapping of specific workloads/workload types to corresponding configurable network topologies including any cabling connections interconnecting components at the node(s). The table that can be accessed to obtain, for a particular workload specified to be run, a particular network topology configuration including any cabling connection at or in between nodes of the rack. In an embodiment, using the table, the system will recommend at a configuration stage any required cabling connection to run a specified workload.

In an embodiment, the method 800 is run under control of the chassis management module 70 in the rack system of FIG. 1A and 1B, or an external computing system or node, such as a host or supervisory node. A first step 805, FIG. 9 involves receiving, via a system interface, a specification of a software workload and /or a combination of workloads to run at a node of the rack. Then, at 810, the CMM 70 boots the system, detects a particular network topology based on the workload type, and configures node interconnects and cabling to connect particular CPUs/GPUs and any switches to run the specified workload(s). As part of the configuration process, a user can be prompted to manually configure any cabling connection at the node for interconnecting any components to run the workloads. Upon the CMM 70 booting the networked system configuration and node components, the workload is run at 810. Upon running the specified workload at the node(s), at 815, the system invokes a heat sensor system including sensors 82, 84 provided in the rack 50 to monitor temperature of any zones or areas at the node in the rack or monitor temperature of any specific component in order to determine the existence of any thermal hot spots and/or excessive power conduction at the node when running the workload.

At 820, FIG. 9, a determination is made as to whether the thermal monitoring system detects any thermal hot spots or excessive power use. In an embodiment, off-line analysis processes may be performed to determine a thermal profile, a power profile, and the existence of the thermal/power footprint and corresponding location at the node.

At 820, if it is determined that no thermal/power footprint exists, then the system may proceed to step 835 and record the particular network topology used for that particular workload for addition to the mapping table.

If, at 820, it is determined that a thermal/power footprint exists when running the workload, then the system may proceed to step 825 to automatically reconfigure/modify CPU/GPU component interconnections to a new network topology and move the running workload or portion thereof to another component, e.g., at another cooling zone, for more optimal performance. This may also include mitigating the heat by controlling (turning on/off) a fan, changing the speed of a current running cooling fan, and/or changing the power supply requirements so as to source a different power supply at the particular node or component. This step can further include the system automatically generating a message suggesting or requesting manual intervention to change or modify the network topology cabling configuration to avoid the hot spot/power usage prior to moving the workload.

Upon re-configuring the network topology at 820, and running the specified workload again, the process proceeds to 830, FIG. 9 where a determination is made as to whether thermal hot spots or excessive power conduction has been eliminated when running this workload, and/or in conjunction, determines whether the full performance of the CPU/GPU interconnects is optimally achieved for that workload.

At 830, if it is determined that no thermal/power footprint exists, and the network components optimally perform, then the system may proceed to step 835 and record the current particular network topology used for that particular workload for addition to the mapping table.

If, at 830, it is detected that a thermal/power footprint still exists when running the workload, then the system may proceed back to 825 to again automatically reconfigure/modify CPU/GPU and other component interconnections to a new network topology and move the running workload or portion thereof to another component(s) for more optimal performance. This can again include the system suggesting or requesting manual intervention to change or modify the network topology cabling configuration to avoid the detected hot spot/power usage prior to moving the workload.

In the embodiment depicted in FIG. 9, the method steps 825-830 are repeated for the workload until the network topology in the rack-mount system is optimally reconfigured with the GPU/CPU interconnects such that the particular workload will optimally run by avoiding the thermal hot spots and/or excessive power usage at any one node.

The method steps depicting FIG. 9 can be run for different types and/or combinations of workloads to run at compute node(s) of the rack.

Figure 10:
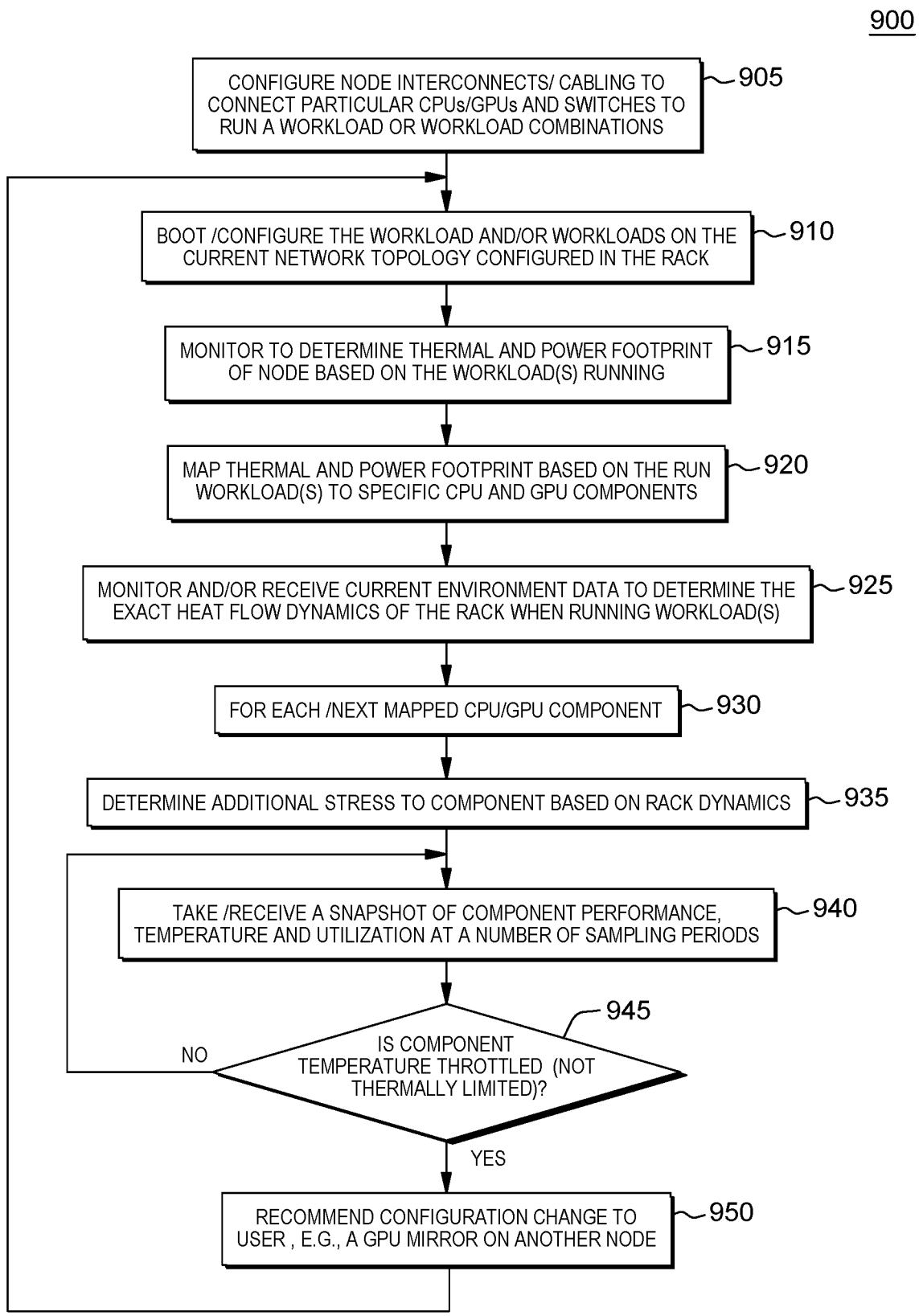
FIG. 10 depicts a further method to reconfigure CPU/GPU interconnections and corresponding network topologies when running a workload in single carrier or rack-based platforms of multiple carriers to avoid thermal hot spots according to an embodiment.

FIG. 10 depicts a further method 900 to reconfigure CPU/GPU interconnections and corresponding network topologies when running a workload in single carrier or rack-based platforms of multiple carriers to avoid thermal hot spots and power spots and to improve performance of the configured CPU/GPU interconnects. The steps 900 of FIG. 10 depict a methodology run by a host node or CMM 70 to consistently look for power and thermal throttling in the rack-based environment.

The method 900 of FIG. 10, in one implementation, ascertains thermal and power spots on rack-based servers that involve GPU's. Over time, a mapping is developed to associate any detected hot spots with the physical location of the GPU/CPU. Additionally, heat sensor systems are controlled to detect existence and impact of pre-heated air and air flow systems in the rack and determine the exact thermal dynamics of the rack while running workloads. Based on the mapping, an analysis can be performed to extrapolate the workload stress on the GPU based on location and consider a possible new topology to mitigate the thermal and/or power hot spot issue. In an embodiment, the system can recommend a GPU "flip" functionality to mitigate thermal and power hot spot scenarios. GPU Flip is a feature where the roles of the GPU can be reversed with or without the cabling infrastructure change, and that will move the existing workload CPU/GPU usage in a different pattern to reduce the oversubscribed power supply or change the thermal hot spot. In an embodiment, the process of feeding back the thermal and power behavior in the rack, to invoke changes in the workload and in turn the reconfigurable approach, is provided in cases where moving a workload to mitigate the hotspot cannot be achieved.

In an embodiment, firmware that can be built into the chassis management module 70 (rack infrastructure) creates thermal and power spots for all the GPUs, providing clues as to which are possible areas of influence due to a case of repeatable workload nature, and possible topology adjustments that can be done to mitigate that. The monitoring performed takes into account all the available infrastructure, such as by determining a thermal and power hot spot based on other dynamics within the rack, e.g., considering preheated air by the operating components, etc.

Step 905, FIG. 10 depicts configuring a network topology including component interconnections and/or cabling to connect particular CPUs/GPUs and switches to run a workload or workload combinations.

Step 910 depicts the booting of workloads to run on the network topology configured in the rack. Then, at 915, there is performed thermal/heat sensor monitoring to determine thermal and power footprints of node based on the workload(s) running in the rack. At 920, the system generates a mapping of the thermal and power footprint based on the run workload(s) to specific CPU and GPU components. This includes, at 925, monitoring and/or receiving current rack environment data to determine the exact heat flow dynamics of the rack when running workload(s). This may include receiving and analyzing data from multiple sources like a Service processor, the CMM, the on chip controller (OCC), etc.. This data is tabulated to a format that can be readily consumed. For example, the OCC is configured to maintain the temperature, power intake, frequency of the chip and instructions per second kind of parameters in a regular basis. The infrastructure can interface with the OCC to get relevant information in order to make a decision. In an embodiment, the analysis can include collecting a physical layout of components configured in the topology system based on system type and populated components discovered at boot time, and include preheat relationship of components. The data may be tabulated with rows consisting of data including:

i. System ID
ii. Component ID
iii. Preheated-by (some other component ID)

The following steps 930 to 955 are repeated, where, at 930, for each CPU/GPU component in the map generated at step 920, further analysis is performed at 935 to determine whether additional stress impacts the component based on rack environment and thermal dynamics, including and any pre-heat relationships.

Then, at 940, the firmware initiates operations to obtain and receive current sensor data consisting of a snapshot including the component's performance, temperature and utilization measures. This step of obtaining a performance snapshot is performed periodically, e.g., over a configurable number of sampling periods or counts and/or over a configurable time duration.

While the workload is being run, and subsequent to the snapshot sampling period, at 945, FIG. 10, a determination is made as to whether the component is (has remained) temperature throttled or is thermally limited. If the component is not thermal throttling, i.e., is thermally limited, then the process returns to step 940 where the performance snap shot is periodically taken. In an embodiment, steps 940, 945 obtain the performance snapshot for each component and ensure full component performance indefinitely.

Returning to step 945, if it is determined based on multiple samples (snapshots) of the component's performance, temperature and utilization that the component's temperature is throttling or is no longer thermally limited (i.e., a thermal hot spot develops), then at 950, the rack control system (e.g., CMM 70) may suggest and/or automatically configure a component "flip", i.e., configure a similar or mirror topology, moving the component mirrored to another location, e.g., another cooling zone. Then, the system continues to run by returning to step 920 in order to boot up the workload to the portion at the mirrored or "flipped" component at the new rack node location.

In embodiments, besides re-configurability at a single node, the re-configurability is extended across nodes of a rack, to help in a scale out model where, for example, multiple GPUs are connected across multiple nodes. For instance, in the rack-based infrastructure deploying similar workloads, if a bias develops towards specific GPU overusage, which might create power and thermal hot spots, these can be mitigated by re-configuring the mirror topology of the GPU in alternative nodes or nodes where the hot spot is seen, thereby effectively reducing the cooling requirement and power supply over rating.

Figure 11:
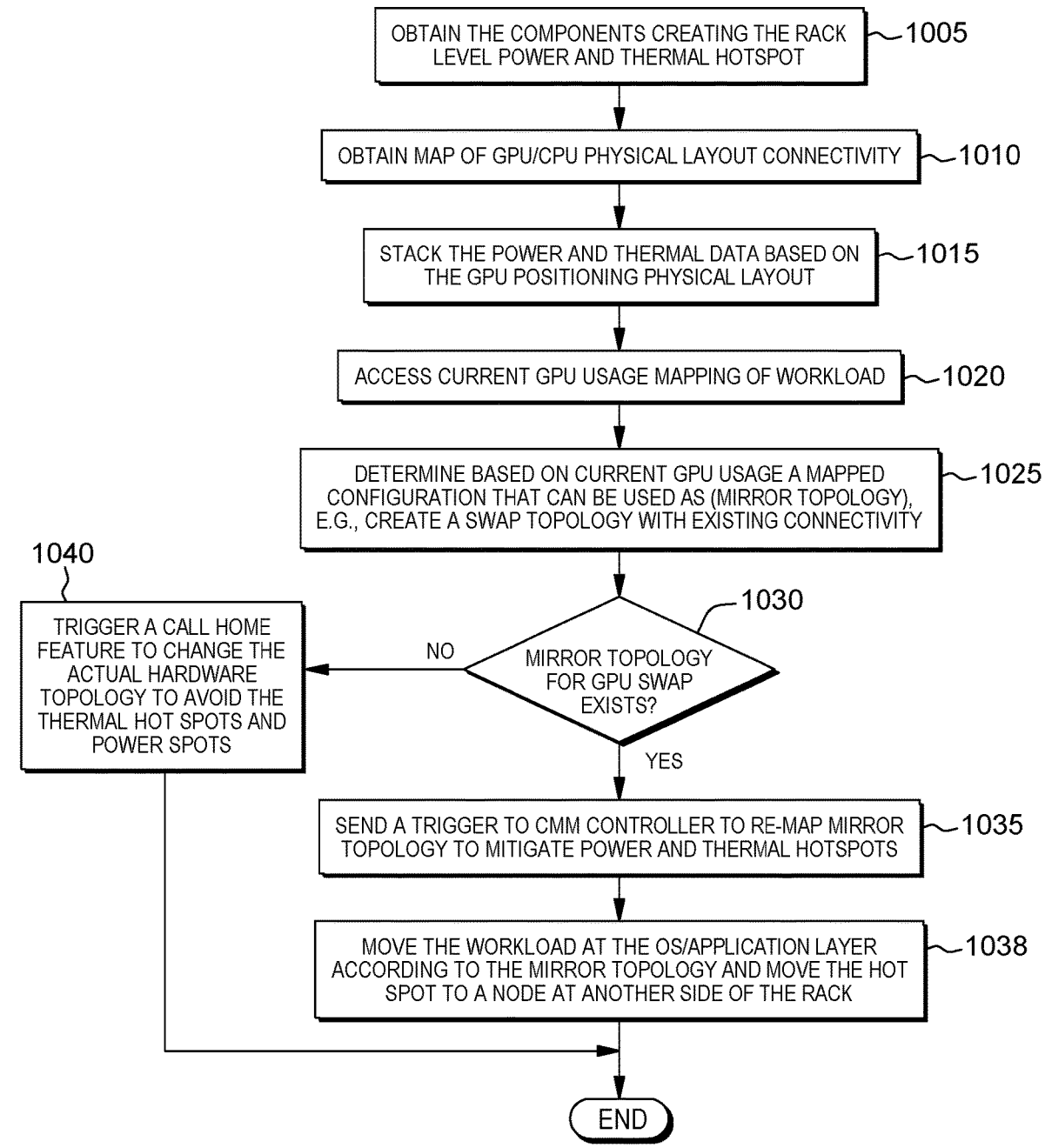
FIG. 11 depicts a further method to associate particular network topology configurations with workloads running in the rack-mount system, according to a further embodiment.

FIG. 11 depicts a further method to associate particular network topology configurations with workloads running in the rack-mount system. At a first step 1005, the CMM 70 obtains the components identified as creating the rack level power and thermal hotspot. Further, at 1010, the CMM 70 obtains a map of GPU/CPU physical layout connectivity. Then, at 1015, the method performs a stacking of the power and thermal data based on the GPU positioning physical layout. Stacking of the power and thermal data refers to ordering the thermal data based on the physical layout (e.g., by weightage of the position) to determine the influence of one component's temperature over the other. The step is performed to detail the thermal spot by usage and pre-heat effects from one chip to the other.

Continuing at 1020, FIG. 11, there is further depicted the step of obtaining the current GPU usage mapping of workload. Then, at 1025, a determination is made, based on current GPU usage mapping, a mapped configuration can be used as mirror topology, i.e., create a swap topology with existing connectivity. Then, at 1030, a determination is made as to whether a mirror topology for GPU swap exists.

If, at 1030, the system determines a mirror topology for GPU swap exists, then at 1035, the firmware can send a trigger to the CMM controller to automatically re-map mirror topology to mitigate any detected power and/or thermal hotspots.

Then, at 1038, the system moves the workload at the OS/Application layer according to the mirror topology and move the hot spot to a node, e.g., in another cooing zone such as at a node at another side of the rack.

In an embodiment, the workload can be moved by the OS/Application layer to suit the mirror topology lookup table such as described in accordance with the teachings of herein-incorporated co-pending U.S. patent application Ser. No. 16/106,847, and hence moving the hot spot to another side of the rack.

However, if at 1030, the system determines a mirror topology which is one implementation of the GPU Flip for GPU swap exists, then at 1040, the workload can trigger a call home feature to change the actual hardware topology to avoid the thermal hot spots and/or power hot spots.

At any given time, the application or a benchmark can deploy CPU/GPU data movement in sync with the current topology, in other words, purely adaptive to the hardware, and the best performance is then achieved in terms of improved latency, lower cost, and power consumption.

In embodiments, arrays of multiple re-configurable network architecture motherboards each, for example, having a same mechanical physical and thermal layout, may be employed as rack-mounted systems each singularly or in combination with the ability to configure and/or reconfigure the architecture by interconnecting CPU and GPU processing nodes using cable links on same or different motherboards.

Various GPU data transfer topology architectures using the re-configurable network architectures of the embodiments depicted in FIGS. 2-8 are described in herein-incorporated co-pending U.S. patent application Ser. No. 16/106, 847.

Further, various high-speed GPU/CPU communication link and PCIe bus network architectures hard-wired on-board a PCB platform (motherboard) that are based upon different combinations of configurable high-speed GPU/CPU communication link, e.g., NVLink, cable connections and certain PCIe bus connections, are described in herein-incorporated co-pending U.S. patent application Ser. No. 16/106,847.

Figure 12:
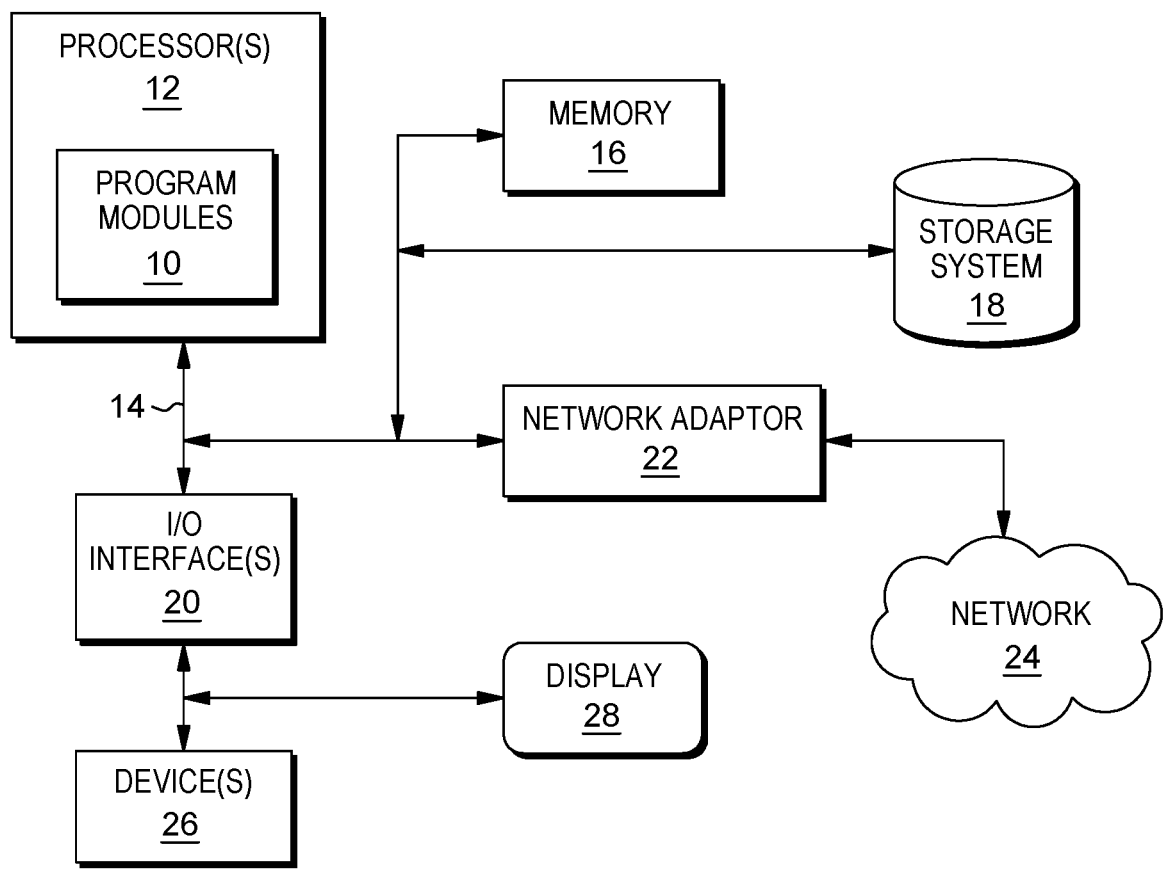
FIG. 12 depicts an exemplary system in accordance with embodiments of the present invention.

FIG. 12 illustrates an example computing system in accordance with the present invention that may provide the functions associated with re-configuring hardware network topologies in according with the present embodiments. It is to be understood that the computer system depicted is only one example of a suitable processing system and is not intended to suggest any limitation as to the scope of use or functionality of embodiments of the present invention. For example, the system shown may be operational with numerous other general-purpose or special-purpose computing system environments or configurations.

In some embodiments, the computer system may be described in the general context of computer system executable instructions, embodied as program modules stored in memory 16, being executed by the computer system. Generally, program modules may include routines, programs, objects, components, logic, data structures, and so on that perform particular tasks and/or implement particular input data and/or data types in accordance with the methods described in FIGS. 9-11.

The components of the computer system may include, but are not limited to, one or more processors or processing units 12, a memory 16, and a bus 14 that operably couples various system components, including memory 16 to processor 12. In some embodiments, the processor 12 may execute one or more modules 10 that are loaded from memory 16, where the program module(s) embody software (program instructions) that cause the processor to perform one or more method embodiments of the present invention. In some embodiments, module 10 may be programmed into the integrated circuits of the processor 12, loaded from memory 16, storage device 18, network 24 and/or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system may include a variety of computer system readable media. Such media may be any available media that is accessible by computer system, and it may include both volatile and non-volatile media, removable and non-removable media.

Memory 16 (sometimes referred to as system memory) can include computer readable media in the form of volatile memory, such as random access memory (RAM), cache memory and/or other forms. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

The computer system may also communicate with one or more external devices 26 such as a keyboard, a pointing device, a display 28, etc.; one or more devices that enable a user to interact with the computer system; and/or any devices (e.g., network card, modem, etc.) that enable the computer system to communicate with one or more other computing devices. Such communication can occur via Input/Output (I/O) interfaces 20.

Still yet, the computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with the computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all elements in the claims below are intended to include any structure, material, or act for performing the function in combination with other claimed elements as specifically claimed.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A configurable hardware network architecture for a rack-mount server comprising:
    a plurality of computing nodes, each node embodied as a printed circuit board (PCB) platform, and communicatively coupled through a backplane within a rack-mount server chassis;
    one or more power supplies electrically coupled to the plurality of computing nodes;
    one or more cooling elements within the rack-mount server chassis, each designed to provide cooling to a specific region within the rack-mount server chassis;
    one or more heat sensors placed within the rack-mount server chassis, and operable to detect temperatures from different regions and components with the rack-mount server chassis; and
    a chassis management module (CMM) for monitoring and directing workload between and within the plurality of computing nodes;
    wherein each computing node comprises:
        wired connections for routing signals between electronic devices, said electronic devices comprising multiple graphics processing units (GPUs) for carrying out first sets of operations, a central processing unit (CPU) for carrying out second sets of operations, and a memory storage associated with the CPU and GPUs;
        the CPU and each of the multiple said GPUs having an associated one or more high-speed connectors capable of providing communications at a first byte speed and available for cable-connection at or near a surface of said computing node, wherein the CPU can communicate directly with any of the multiple GPUs via respective associated high-speed connectors when the respective associated high-speed connectors are linked via an appropriate cable, and wherein each GPU can communicate directly with another GPU of the multiple GPUs via respective associated high-speed connectors when the respective associated high-speed connectors are linked via an appropriate cable; and
    wherein the CMM is configured to monitor various workloads performed and detect thermal hot spot conditions at one or more components within the computing node via one or more heat sensors, and to determine, for a user, cabling between high-speed connectors that would improve ability to balance workload and mitigate identified thermal hot spot conditions at one or more components within the PCB platform.

2. The configurable hardware network architecture of claim 1, wherein said directly linking said one or more GPUs of said multiple GPUs for communications at the first byte speed comprises using a first high speed interface cable link to connect respective said high-speed connectors of:
    a first GPU and a second GPU of said first multiple GPUs;
    a third GPU and a fourth GPU of said first multiple GPUs;
    a first GPU and a third GPU of said first multiple GPUs; and/or a second GPU and a fourth GPU of said first multiple GPUs on the same node or across separate nodes within the rack-mount server chassis.

3. The configurable hardware network architecture of claim 1, wherein said electronics devices further comprise:
a first high speed switch configurable for enabling switched hardwire connections on each said node allowing communications at a second byte speed between said first CPU and one or more said first GPU, said second GPU, and a first external network connection; and
a second high speed switch on each said node configurable for enabling switched hardwire connections on each said node allowing communications at a second byte speed among said third GPU and said fourth GPU of said first multiple GPUs and a second external network connection.

4. The configurable hardware network architecture of claim 3, wherein said first GPU is hardwire connected in said node to each said third GPU and fourth GPU of said multiple GPUs via respective high speed communication links on said PCB platform for communications at said first byte speed, and said second GPU is hardwire connected in each said node to each said third GPU and fourth GPU of said multiple GPUs via respective high speed communication links on each said PCB platform for communications at said first byte speed.

5. The configurable hardware network architecture of claim 4, wherein each said node within the rack-mount server chassis further comprises:
a second CPU having second multiple said GPUs associated therewith, said second CPU having an associated one or more said first high-speed connectors for providing communications at said first byte speed, the high-speed connectors of said second CPU available for cable-connection at or near a surface of each said node within the rack-mount server chassis, wherein the second CPU can communicate directly with any of the second multiple GPUs via respective associated high-speed connectors when the respective associated high-speed connectors are linked via an appropriate cable; and
each said second multiple GPUs associated with said second CPU having an associated high-speed connector for providing communications at the first byte speed, the high-speed connectors of each said second multiple GPUs available for cable-connection at or near a surface of each said node within the rack-mount server chassis, and wherein each GPU can communicate directly with another GPU of the second multiple GPUs via respective associated high-speed connectors when the respective associated high-speed connectors are linked via an appropriate cable;
wherein the CMM is configured to, based on said monitored workloads performed and detected thermal hot spot conditions at one or more components within the computing node via one or more heat sensors, determine, for a user, a cabling between high-speed connectors that would improve ability to balance workload and mitigate identified thermal hot spot conditions at one or more components within the PCB platform.

6. The configurable hardware network architecture of claim 5, wherein said directly linking said one or more GPUs of said second multiple GPUs for communications at the first byte speed comprises using a first high speed interface cable link to connect respective said high-speed connectors of:
a fifth GPU and a sixth GPU of said second multiple GPUs;
a seventh GPU and an eighth GPU of said second multiple GPUs;
a fifth GPU and a seventh GPU of said second multiple GPUs; and/or
a sixth GPU and an eighth GPU of said second multiple GPUs on the same node or across separate nodes within the rack-mount server chassis.

7. The configurable hardware network architecture of claim 6, wherein said electronics devices further comprise:
a third high speed switch configurable for enabling switched hardwire connections on each said node allowing communications at said second byte speed between said second CPU and one or more said fifth GPU, said sixth GPU, and a third external network connection; and
a fourth high speed switch on each said node configurable for enabling switched hardwire connections on said PCB platform allowing communications at a second byte speed among said seventh GPU and said eighth GPU of said second multiple GPUs and a fourth external network connection.

8. The configurable hardware network architecture of claim 7, wherein said fifth GPU is hardwire connected in each said PCB platform to each said seventh GPU and eighth GPU of said second multiple GPUs via respective high speed communication links on a same said node or separate nodes for communications at said first byte speed, and said sixth GPU is hardwire connected in each said node to each said seventh GPU and eighth GPU of said second multiple GPUs via respective high speed communication links on the same node or separate node for communications at said first byte speed.

9. The configurable hardware network architecture of claim 5, wherein a GPU of said multiple GPUs is hardwire connected on said node to at least a respective GPU of said second multiple GPUs via respective high speed communication links on the same node or separate node for communications at said first byte speed in said rack-mount server.

10. The configurable hardware network architecture of claim 5, wherein said network architecture is further configurable by directly connecting a high speed interface cable link for communications at said first byte speed between a high-speed connector of a GPU of said first multiple GPUs and a high-speed connector of a GPU of said second multiple GPUs at the same node or separate node within the rack-mount server chassis.

11. The configurable hardware network architecture of claim 7, wherein said electronics devices further comprise:
a switched multiplexor configurable to provide a switched wired connection on each said node for allowing communications between said first CPU and one or more said third GPU and said fourth GPU of said first multiple GPUs and a second external network connection via said second high speed switch at said second byte speed; and
the switched multiplexor being further configurable to provide a further switched wired connection on said node for allowing communications between said second CPU and one or more said seventh GPU and said eighth GPU of said second multiple GPUs and the fourth external network connection via said fourth high speed switch at said second byte speed.

12. The configurable hardware network architecture of claim 7, wherein said electronics devices further comprise:

a cross-switching multiplexor configurable to provide a switched wired connection on each said node for allowing direct high-speed communications at said second byte speed between said first CPU and said seventh GPU and eighth GPU of said second multiple GPUs, and a fourth external network connection via said fourth high speed switch; said cross-switching multiplexor further configurable to provide a switched wired connection on said node for allowing direct high-speed communications at said second byte speed between said second CPU and said third GPU and said fourth GPU of said first multiple GPUs and a second external network connection via said second high speed switch.

13. A method of configuring a hardware network architecture for running a workload on one or more computing nodes in a rack-mount server chassis communicatively coupled through a backplane within a rack-mount server chassis, the method comprising:

determining, by a chassis management module (CMM), a hardware network topology based on the workload to be run at one or more computing nodes in said rack-mount server chassis, each computing node embodied as a Printed Circuit Board (PCB) platform, each computing node comprising:
wired connections for routing signals between electronic devices, said electronic devices comprising multiple graphics processing units (GPUs) for carrying out first sets of operations, a central processing unit (CPU) for carrying out second sets of operations, and a memory storage associated with the CPU and GPUs;

the CPU and each of the multiple said GPUs having an associated one or more high-speed connectors capable of providing communications at a first byte speed and available for cable-connection at or near a surface of said computing node, wherein the CPU can communicate directly with any of the multiple GPUs via respective associated high-speed connectors when the respective associated high-speed connectors are linked via an appropriate cable, and wherein each GPU can communicate directly with another GPU of the multiple GPUs via respective associated high-speed connectors when the respective associated high-speed connectors are linked via an appropriate cable;

detecting, using the CMM, thermal hot spot conditions at one or more components within the computing node based on monitored temperatures and associated with the workload; and based on the detected thermal hot spot conditions of one or more components at the hardware network topology of said node, recommend a re-configuring of the hardware network topology that can be implemented by adding or subtracting one or more direct connected cable links between the CPU and GPU or between GPUs of said multiple GPUs on the same node or separate nodes in said rack-mount server chassis, said CMM moving the workload or a workload portion to the same node or separate node in said rack-based server.

14. The method according to claim 13, further comprising:

running, using the CMM, the workload run at a CPU using said re-configured hardware network topology;

detecting, using the CMM, any further thermal hot spot conditions of one or more components for the re-configured hardware network topology based on running the workload; and repeating the running of said workload using said re-configured hardware network topology, the detecting of further thermal hot spot conditions of one or more components for each hardware network re-configuration, the recommending, re-configuring of said hardware network topology and said moving the workload or a workload portion to the same node or separate node until the workload is optimally run at said CPUs and GPUs to avoid detected thermal hot spots, a performance index of a re-configured hardware network topology being optimized for running said workload.

15. The method according to claim 13, wherein said detecting thermal hot spot conditions of one or more components comprises:

determining, using one or more heat sensor devices, a thermal footprint of a compute node based on locations of a CPU/GPU component detected to exhibit thermal throttling or drawing excessive power on said node within the rack-mount server chassis; and determining, using one or more sensor devices, an impact of any air flows based on heated components that impact other components; and said method further comprising:

determining, using said CMM, a mirror location of a GPU component capable of handling the workload or workload portion on another separate node such that said workload or workload portion is transferred to said GPU component on said another separate node for processing said workload or portion thereof.

16. The method according to claim 14, wherein said recommending a re-configuring of the hardware network topology comprises: determining to add or remove one or more cable link connections between the GPU and a CPU and/or between the GPU and another GPU on a same node or across separate compute nodes.

17. A computer program product comprising a non-transitory computer-readable medium including instructions that, when executed by a computer processor of a computer system, configure the computer processor to perform a method of configuring a hardware network architecture for running a workload on one or more computing nodes in a rack-mount server chassis, the method comprising:

determining a hardware network topology based on the workload to be run at one or more computing nodes in said rack-mount server chassis, each computing node embodied as a Printed Circuit Board (PCB) platform, each computing node comprising:
wired connections for routing signals between electronic devices, said electronic devices comprising multiple graphics processing units (GPUs) for carrying out first sets of operations, a central processing unit (CPU) for carrying out second sets of operations, and a memory storage associated with the CPU and GPUs;

the CPU and each of the multiple said GPUs having an associated one or more high-speed connectors capable of providing communications at a first byte speed and available for cable-connection at or near a surface of said computing node, wherein the CPU can communicate directly with any of the multiple GPUs via respective associated high-speed connectors when the respective associated high-speed connectors are linked via an appropriate cable, and wherein each GPU can communicate directly with another GPU of the multiple GPUs via respective associated high-speed connectors when the respective associated high-speed connectors are linked via an appropriate cable;

detecting thermal hot spot conditions, associated with the workload, at one or more components within the computing node based on monitored temperatures; and based on the detected thermal hot spot conditions of one or more components at the hardware network topology of said node, recommend a re-configuring of the hardware network topology that can be implemented by adding or subtracting one or more direct connected cable links between the CPU and GPU or between GPUs of said multiple GPUs on the same node or separate nodes in said rack-mount server chassis, and, responsive to the hardware network topology being reconfigured, said computer processor moving the workload or a workload portion to the same node or separate node in said rack-based server.

18. The computer program product according to claim 17, wherein said method further comprises:

running the workload run at a CPU using said re-configured hardware network topology;

detecting any further thermal hot spot conditions of one or more components for the re-configured hardware network topology based on running the workload; and repeating the running of said workload using said re-configured hardware network topology, and the detecting of further thermal hot spot conditions of one or more components for each hardware network re-configuration, and the determining of a re-configuration of said hardware network topology based on running the workload until the workload is optimally run at said CPUs and GPUs to avoid detected thermal hot spots, a performance index of a re-configured hardware network topology being optimized for running said workload.

19. The computer program product according to claim 18, wherein said detecting thermal hot spot conditions of one or more components comprises:

determining, using one or more sensor devices, a thermal footprint of a compute node based on locations of a CPU/GPU component detected to exhibit thermal throttling or drawing excessive power on said PCB board within the rack-mount server chassis; and determining, using one or more sensor devices, an impact of any air flows based on heated components that impact other components; and said method further comprising:

determining a mirror location of a GPU component capable of handling the workload or workload portion on another separate node such that said workload or workload portion is transferred to said GPU component on said another separate node for processing said workload or portion thereof.

20. The computer program product according to claim 17, wherein said determining the re-configuration comprises: determining one or more cable link connections to add or subtract between the GPU and a CPU and/or between the GPU and another GPU on a same compute node or across separate compute nodes.

* * * * *